(12) United States Patent
Kirby et al.

(10) Patent No.: US 11,769,738 B2
(45) Date of Patent: Sep. 26, 2023

(54) APPARATUSES EXHIBITING ENHANCED STRESS RESISTANCE AND PLANARITY, AND RELATED MICROELECTRONIC DEVICES AND MEMORY DEVICES

(71) Applicant: Micron Technology, Inc., Boise, ID (US)

(72) Inventors: Kyle K. Kirby, Boise, ID (US); Chao Wen Wang, Central Taiwan Science Park (TW)

(73) Assignee: Micron Technology, Inc., Boise, ID (US)

( * ) Notice: Subject to any disclaimer, the term of this patent is extended or adjusted under 35 U.S.C. 154(b) by 101 days.

(21) Appl. No.: 17/339,560

(22) Filed: Jun. 4, 2021

(65) Prior Publication Data

US 2021/0296289 A1 Sep. 23, 2021

Related U.S. Application Data

(62) Division of application No. 16/554,986, filed on Aug. 29, 2019, now Pat. No. 11,056,443.

(51) Int. Cl.
*H01L 23/00* (2006.01)
*H01L 23/528* (2006.01)
(Continued)

(52) U.S. Cl.
CPC ........ *H01L 23/562* (2013.01); *H01L 21/4875* (2013.01); *H01L 21/56* (2013.01);
(Continued)

(58) Field of Classification Search
CPC ................... H01L 23/562; H01L 2225/06513
See application file for complete search history.

(56) References Cited

U.S. PATENT DOCUMENTS

| 7,531,407 B2 | 5/2009 | Clevenger et al. |
| 7,615,411 B2 | 11/2009 | Jobetto |
| (Continued) | | |

FOREIGN PATENT DOCUMENTS

| CN | 109994446 A | 7/2019 |
| CN | 110137144 A | 8/2019 |

OTHER PUBLICATIONS

Chinese First Office Action for Application No. 202010870053.4, dated Aug. 16, 2021, 16 pages with English Translation.

*Primary Examiner* — Farun Lu
(74) *Attorney, Agent, or Firm* — TraskBritt

(57) ABSTRACT

An apparatus comprises conductive segments comprising an uneven topography comprising upper surfaces of the conductive segments protruding above an upper surface of underlying materials, a first passivation material substantially conformally overlying the conductive segments, and a second passivation material overlying the first passivation material. The second passivation material is relatively thicker than the first passivation material. The apparatus also comprises structural elements overlying the second passivation material. The second passivation material has a thickness sufficient to provide a substantially flat surface above the uneven topography of the underlying conductive segments at least in regions supporting the structural elements. Microelectronic devices, memory devices, and related methods are also disclosed.

20 Claims, 10 Drawing Sheets

(51) Int. Cl.

| | | |
|---|---|---|
| *H01L 23/31* | (2006.01) | |
| *H01L 23/29* | (2006.01) | |
| *H01L 25/065* | (2023.01) | |
| *H01L 21/74* | (2006.01) | |
| *H01L 21/56* | (2006.01) | |
| *H01L 21/48* | (2006.01) | |
| *H01L 23/492* | (2006.01) | |
| *H01L 23/532* | (2006.01) | |
| *H01L 23/538* | (2006.01) | |

(52) U.S. Cl.
CPC .......... *H01L 21/743* (2013.01); *H01L 23/291* (2013.01); *H01L 23/293* (2013.01); *H01L 23/3192* (2013.01); *H01L 23/4924* (2013.01); *H01L 23/528* (2013.01); *H01L 23/5385* (2013.01); *H01L 23/5386* (2013.01); *H01L 23/53214* (2013.01); *H01L 23/53228* (2013.01); *H01L 25/0657* (2013.01); *H01L 2225/06513* (2013.01)

(56) References Cited

U.S. PATENT DOCUMENTS

| | | |
|---|---|---|
| 7,750,483 B1 | 7/2010 | Lin et al. |
| 7,811,863 B1 | 10/2010 | Lin et al. |
| 7,923,304 B2 | 4/2011 | Choi et al. |
| 8,158,508 B2 | 4/2012 | Lin et al. |
| 8,461,601 B2 | 6/2013 | Herrmann |
| 8,999,816 B1 | 4/2015 | Holden et al. |
| 9,269,646 B2 | 2/2016 | Luo et al. |
| 9,460,966 B2 | 10/2016 | Lei et al. |
| 9,773,719 B2 | 9/2017 | Meinhold et al. |
| 10,714,438 B2 | 7/2020 | Ahn et al. |
| 10,847,447 B2 | 11/2020 | Kim et al. |
| 2011/0221057 A1* | 9/2011 | Lin .................. H01L 21/78 438/114 |
| 2013/0256878 A1* | 10/2013 | Hsu .................. H01L 24/08 257/737 |
| 2014/0103520 A1 | 4/2014 | Kirby et al. |
| 2015/0162346 A1 | 6/2015 | Choi et al. |
| 2017/0125369 A1* | 5/2017 | Jeong ................ H01L 24/02 |
| 2017/0372961 A1 | 12/2017 | Kirby et al. |
| 2018/0164698 A1* | 6/2018 | Yang .............. H01L 21/76837 |
| 2018/0342475 A1 | 11/2018 | Wirz et al. |
| 2019/0172725 A1 | 6/2019 | Fay et al. |

\* cited by examiner

APPARATUSES EXHIBITING ENHANCED STRESS RESISTANCE AND PLANARITY, AND RELATED MICROELECTRONIC DEVICES AND MEMORY DEVICES

CROSS-REFERENCE TO RELATED APPLICATION

This application is a divisional of U.S. patent application Ser. No. 16/554,986, filed Aug. 29, 2019, the disclosure of which is hereby incorporated herein in its entirety by this reference.

TECHNICAL FIELD

Embodiments of the disclosure relate to microelectronic devices and microelectronic device fabrication. More particularly, embodiments of the disclosure relate to an apparatus exhibiting enhanced stress resistance and planarity, and to related methods, memory devices, and electronic systems.

BACKGROUND

Increased circuit density is an ongoing goal of manufacturers of microelectronic devices. One favored configuration is three-dimensional (3D) assembly of vertically stacked semiconductor dice, at least some of which are interconnected electrically and the stacked die assembly being mechanically and electrically connected to higher level packaging, such as an interposer or other base material (e.g., substrate) bearing conductive traces.

One configuration employing stacked dice is a Micropillar Grid Array Package ("MPGA"). Such a package comprises a stack of (for example four (4)) dynamic random access (DRAM) semiconductor memory dice vertically interconnected with conductive pillars from an uppermost die to a lowermost die, and conductive pillars extending from the underside of the lowermost memory die for connection to a logic die or a System on a Chip (SoC) die. The provider of the logic die or the SoC die conventionally mounts their device to an interposer, such as a ball grid array (BGA) substrate, the logic or SoC die including conductive pads for connection to the conductive pillars on the underside of the MPGA and through vias for connecting to the substrate. The MPGA is mounted to the logic die or SoC die on the interposer and the assembly is then overmolded with an encapsulant into a finished Ball Grid Array (BGA) package, which configuration may be implemented as a so-called "Wide I/O" memory device, enabling fast memory access and reduced power requirements.

Further, as the MPGA die assembly incorporates a high-speed logic die below a vertical stack of DRAM dice interconnected with through-silicon vias (TSVs), the DRAM dice are configured specifically to only handle data, while the logic die provides all DRAM control within the die assembly. The design reduces latency, and greatly improves bandwidth and speed, while offering significantly reduced power demand and physical space requirements and providing flexibility for multiple platforms and application through use of different logic dice. One such implementation of a die assembly as described above may be characterized as a Memory Cube DRAM (MCDRAM) comprising a thermally conductive overmold over the DRAM dice and in contact with the logic die where it extends peripherally beyond the stack of DRAM dice. DRAM memory stacks may also include double data rate (DDR) type synchronous DRAM (SDRAM) devices, such as double data rate type four (DDR4), double data rate type five (DDR5), double data rate type six (DDR6), etc. Additional implementations of similar die assemblies may include Hybrid Memory Cube (HMC) and High Bandwidth Memory (HBM), the latter of which associates device logic with the DRAM die stack and separate host logic with a processor.

One significant concern with regard to implementation of such 3D semiconductor die assemblies is the issue of providing adequate stress distribution between base material (i.e., semiconductor dice) and overlying structures, often in the form of pillars protruding from active surfaces of the semiconductor dice and used to provide mechanical connections, thermal connections, or both, to another semiconductor die, interposer or other structure above or below semiconductor dice in a stack and to provide mechanical support between the various components in the stack. Further, design of mutually spaced metallization structures (e.g., conductive traces and pads) on the active surface and underlying the pillars is commonly governed by structural design and/or electrical performance of circuitry of a semiconductor die, without regard to subsequent placement of the pillars that overlie a passivation material between the metallization structures and the pillars. The spacing of such metallization structures results in an uneven topography on the active surface. In conventional devices, a substantially conformal and relatively thin passivation material located over the metallization structures for environmental protection and electrical isolation conforms to the uneven topography of the metallization structures and, so, may not be adequate to withstand stress applied by the pillars when a die stack is formed and electrically conductive elements thereof interconnected by, for example, thermocompression bonding. The thermocompression bonding process also applies force, and thus stress, to the pillars perpendicular to the major planes of the semiconductor dice in the stack and, thus, to the passivation material. In particular, random misalignment of the pillars relative to the underlying metal structures and consequent uneven stress distribution on the passivation material by the pillars may cause stress points, resulting in cracking of the passivation material and compromise integrity of the semiconductor die.

DETAILED DESCRIPTION

Figure 1A:
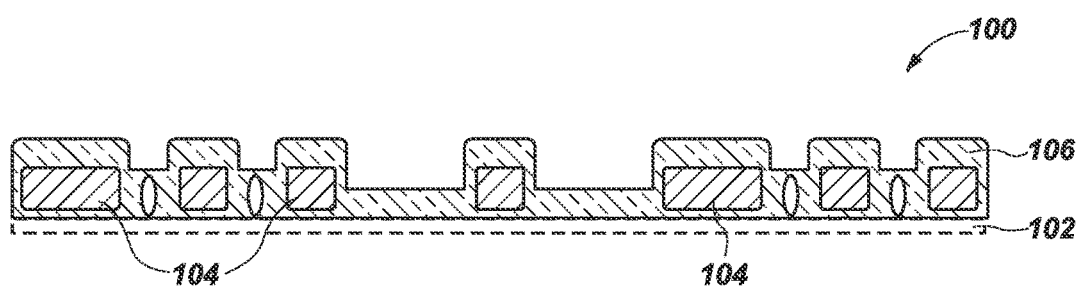
FIGS. 1A-1D are simplified, partial cross-sectional views illustrating various stages of forming a microelectronic device in accordance with embodiments of the disclosure.

A microelectronic device (e.g., an apparatus) includes conductive segments comprising an uneven topography comprising upper surfaces of the conductive segments protruding above an upper surface of underlying materials, a dielectric material (e.g., a first passivation material) substantially conformally overlying the conductive segments, and another dielectric material (e.g., a second passivation material) overlying the first passivation material. The microelectronic device also includes protruding structural elements overlying the second passivation material. The second passivation material may have a thickness sufficient to provide a substantially flat surface above an uneven topography of the underlying conductive segments at least in designated regions supporting the structural elements (e.g., regions proximate to, immediately adjacent to, and/or directly underlying the structural elements) so as to distribute stress applied to the first passivation material, second passivation material and the underlying conductive segments by the structural elements. In some embodiments, the second passivation material may include a lower region and upper regions comprising support structures. Further, support structures (e.g., annular rings) of the upper regions of the second passivation material may comprise discrete portions in direct physical contact with portions of the structural elements extending above the lower region. Alternatively, the structural elements may include one or more base plates overlying the passivation material and, optionally, protrusions from the base plates. The base plates may conform to the topography of the underlying passivation material yet have a thickness sufficient to provide a substantially flat surface above the underlying conductive segments and to distribute stress applied by the protrusions, if present.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a microelectronic device or a complete process flow for manufacturing the microelectronic device and the structures described below do not form a complete microelectronic device. Only those process acts and structures necessary to understand the embodiments described herein are described in detail below. Additional acts to form a complete microelectronic device may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), electroplating, electroless plating, or furnace growth (e.g., diffusion). Further, formation processes may be performed continuously or as a batch process. Alternatively, the materials may be grown in situ. Depending on the specific material to be formed, the technique for depositing or growing the material may be selected by a person of ordinary skill in the art. The removal of materials may be accomplished by any suitable technique including, but not limited to, dry etching, wet etching, wet cleaning, abrasive planarization (e.g., chemical-mechanical planarization), or other known methods unless the context indicates otherwise.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, the term "configured" refers to a size, shape, material composition, and arrangement of one or more of at least one structure and at least one apparatus facilitating operation of one or more of the structure and the apparatus in a pre-determined way.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, the term "microelectronic device" includes without limitation a memory device, as well as other microelectronic devices which may or may not incorporate memory, such as a logic device, a processor device, or a radiofrequency (RF) device. Further, a microelectronic device may incorporate memory in addition to other functions such as, for example, a so-called "system on a chip" (SoC) including a processor and memory, or a microelectronic device including logic and memory. As used herein, the term "memory device" means and includes a microelectronic device exhibiting memory functionality but not necessarily only memory functionality.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, the term "substrate" means and includes a material (e.g., a base material) or construction upon which additional materials are formed. The substrate may be a semiconductor substrate, a base semiconductor material on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOT") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

FIGS. 1A through 1D illustrate a method of forming a microelectronic device in accordance with embodiments of the disclosure.

An apparatus 100 including mutually spaced conductive segments 104 is shown in FIG. 1A. The conductive segments 104 may be located adjacent (e.g., on or over) a base material 102 (e.g., a semiconductor die), as depicted in broken lines. More specifically, the conductive segments 104 may reside on the active surface of the semiconductor die. In some embodiments, the conductive segments 104 may be formed adjacent (e.g., on or over) the base material 102, if present. In other embodiments, the conductive segments 104 may be formed adjacent (e.g., on, directly on) underlying materials (e.g., metal materials and/or insulative materials). The conductive segments 104 may include, for example, conductive traces and pads overlying metal materials (not shown) including routing lines or electrical circuitry. Such materials underlying the conductive segments 104 may include various metal materials (e.g., copper) and insulative materials formed in one or more damascene processes, such as a single-damascene process or a dual-damascene process. Upper surfaces of metal materials and insulative materials formed by such a damascene process are coplanar. Thus, the materials underlying the conductive segments 104 may exhibit a substantially flat upper surface, over which the conductive segments 104 are formed.

The conductive segments 104 may be formed to exhibit any suitable thickness (e.g., a height of a top surface of the conductive segments 104 above a top surface of the underlying materials). By way of non-limiting example, at least some of the conductive segments 104 may be formed to a thickness of between about 5000 Angstroms (Å) and about 7000 Å, in some embodiments. In other embodiments, the conductive segments 104 may include metal portions within a redistribution layer (RDL). In other words, the conductive segments 104 may be embedded within insulative materials (e.g., a dielectric material) forming an RDL. In such embodiments, a total thickness of the RDL, including the conductive segments 104, may be between about 1 µm and about 10 µm, for example. Further, the conductive segments 104 may be mutually spaced from one another resulting in an uneven topography. The conductive segments 104 may be formed of a material including a metal, a metal alloy, or a metal-containing material. By way of example and not limitation, the conductive segments 104 may include aluminum or an alloy thereof.

A first passivation material 106 may be formed adjacent to (e.g., over) at least a portion of the conductive segments 104 and the base material 102. The first passivation material 106 may adapt to the uneven topography of the underlying conductive segments 104 in a substantially conformal manner. In some embodiments, one or more intermediate materials may, optionally, be formed between the first passivation material 106 and the conductive segments 104, such as anti-reflective coatings, barrier materials, etc., as is known in the art. In other embodiments, the first passivation material 106 may be in direct physical contact with the conductive segments 104.

In embodiments, a thickness of the first passivation material 106 may be sufficient to electrically isolate the conductive segments 104 from one another and provide environmental protection and electrical isolation from the environment to the conductive segments. By way of non-limiting example, the first passivation material 106 may be formed to a thickness (e.g., average thickness) of between about 0.8 μm and about 3 μm, such as between about 0.8 μm and about 2.3 μm, or between about 2.3 μm and about 3 μm. In some embodiments, the first passivation material 106 may be formed to a thickness of about 2.3 μm.

The first passivation material 106 may be formed of and include at least one dielectric material including, but not limited to, an oxide, a nitride, or an oxynitride. In particular, the first passivation material 106 may include, but is not limited to, an oxide material (e.g., a silicon oxide material) in some embodiments. Further, the first passivation material 106 may include one or more (e.g., two) portions of materials adjacent one another. For example, the first passivation material 106 may include a first portion (e.g., an oxide material) and a second portion (e.g., a silicon nitride material) overlying the first portion. By way of example and not limitation, the first portion may be formed to a thickness of about 0.8 μm and the second portion may be formed to a thickness of about 1.5 μm. In other embodiments, the first passivation material 106 may be a polyimide material.

The first passivation material 106 may be formed using one or more conventional deposition processes, such as one or more of a conventional ALD process and a conventional CVD process. The passivation material may be blanket deposited, and portions of the first passivation material 106 may then be removed (e.g., as by etching) to expose bond pads on the active surface of the semiconductor die by one or more of conventional etching processes, such as one or more of anisotropic dry etching and anisotropic wet etching, as is known in the art.

Figure 1B:
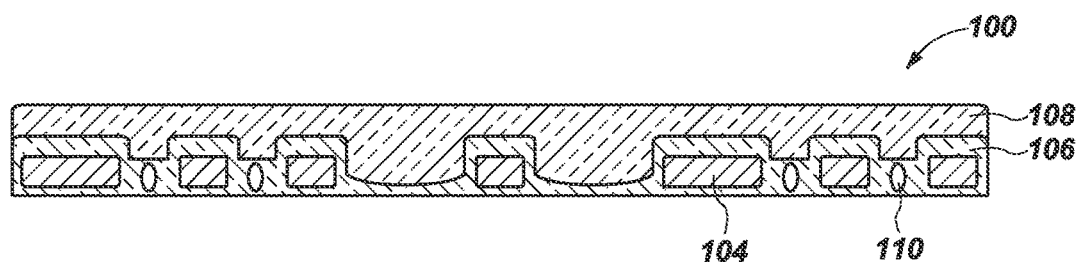

As shown in FIG. 1B, a second passivation material 108 may be formed adjacent (e.g., on or over) exposed surfaces of the first passivation material 106. As shown in FIG. 1B, the second passivation material 108 may substantially fill in and smooth an uneven topography defined by the surfaces (e.g., upper surfaces, side surfaces) of the first passivation material 106 upon which the second passivation material 108 is formed. In other words, the second passivation material 108 may extend from and between side surfaces (e.g., sidewalls) of the first passivation material 106 as well as over upper, horizontal surfaces of the first passivation material 106. In some embodiments, the second passivation material 108 may be in direct physical contact with the first passivation material 106. Further, the second passivation material 108 may be of sufficient thickness to form a substantially continuous, flat material surface over at least a portion of the first passivation material 106. In other words, an upper surface of the second passivation material 108 may be substantially smooth and even, without marked (e.g., pronounced) protrusions and/or indentations. By way of non-limiting example, the upper surface of the second passivation material 108 may have a surface roughness between about 15 nm and about 100 nm, such as between about 50 nm and about 100 nm, or between about 25 nm and about 50 nm, root mean square (RMS). One or more air gaps 110 may reside within portions of the first passivation material 106. The air gaps 110 may laterally intervene between laterally-neighboring conductive segments 104 and serve as insulators (i.e., having a dielectric constant (k) of about 1). The air gaps 110 may limit capacitance (e.g., parasitic capacitance, stray capacitance) and increase shorts margin between laterally-neighboring conductive segments 104, and may reduce cross-talk therebetween. However, the air gaps 110 also comprise structural weak points in the first passivation material 106 which are particularly susceptible to stress cracking.

The second passivation material 108 may be formed to exhibit any suitable thickness. By way of non-limiting example, the second passivation material 108 may be formed to a thickness (e.g., average thickness) of between about 0.5 μm and about 10 μm, such as between about 0.8 μm and about 2.3 μm, between about 2.3 μm and about 5 μm, or between about 5 μm and about 10 μm. In some embodiments, the second passivation material 108 may be formed to a thickness of about 2.3 μm. Further, a combined thickness of the first passivation material 106 and the second passivation material 108 may be between about 1 μm and about 13 μm, for example. In some embodiments, the thickness (e.g., average thickness) of the second passivation material 108 may be relatively greater than the thickness (e.g., average thickness) of the first passivation material 106. In particular, the thickness of the second passivation material 108 may be between about 3 and 15 times (e.g., an order of magnitude) greater than the thickness of the first passivation material 106.

In some embodiments, the second passivation material 108 may be formed of and include at least one dielectric material including, but not limited to, an oxide, a nitride, or an oxynitride. In other embodiments, the second passivation material 108 may be formed of a polyimide material. Further, the second passivation material 108 may be formed of the same material as or formed of a different material from the first passivation material 106. By way of non-limiting example, the second passivation material 108 may be a nitride material (e.g., a silicon nitride or silicon oxynitride material) and the first passivation material 106 may be an oxide material (e.g., a silicon oxide material). In other words, the material of the second passivation material 108 may be formed of a different material having a different etch selectivity than that of the first passivation material 106. In other embodiments, each of the first passivation material 106 and the second passivation material 108 may be formed of the same material, such that there is no easily discernable physical interface therebetween. In yet other embodiments the conductive segments 104 may be covered to a desired thickness with a single passivation material, such as the second passivation material 108, for example. In such embodiments, the second passivation material 108 may be in direct physical contact with the conductive segments 104 and the base material 102 and be of a thickness to extend between, above and over the conductive segments 104 to a great enough height to comprise a substantially planar upper surface in designated regions.

The second passivation material 108 may be formed using conventional processes (e.g., conventional deposition processes, conventional material removal processes) and conventional processing equipment, which are not described in detail herein. For example, the second passivation material 108 may be formed on or over portions of the exposed surfaces of the apparatus 100 using one or more conventional deposition processes (e.g., a conventional CVD or PVD process, or by spin or blanket coating if a polyimide). In some embodiments, the second passivation material 108 may be subjected to at least one conventional planarization process (e.g., at least one conventional CMP process) after formation to facilitate or enhance the planarity of an upper boundary (e.g., upper surface) of the second passivation material 108. In such embodiments, portions of the second passivation material 108 may exhibit a substantially planar upper boundary (e.g., upper surface), and a non-planar lower boundary substantially defined by the topography of the surface (e.g., upper surface) of the first passivation material 106.

Figure 1C:
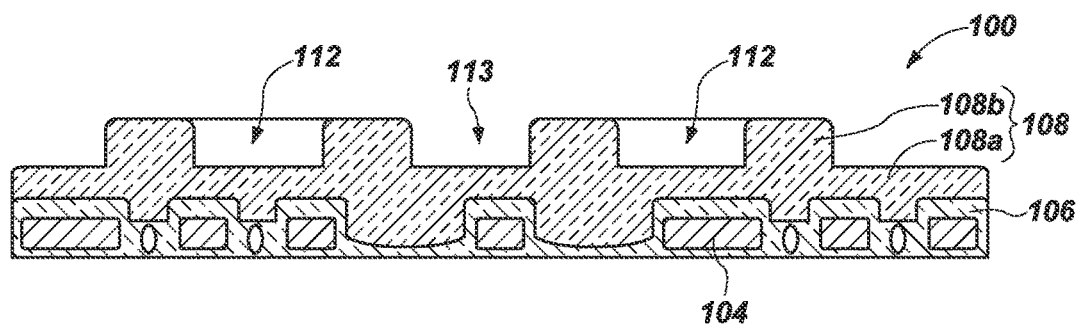

As shown in FIG. 1C, the second passivation material 108 may be formed to include separate portions including, for example, a first portion (e.g., a lower region 108a) and a second portion (e.g., upper regions 108b). In some embodiments, the lower region 108a of the second passivation material 108 may be formed in one or more conventional processes, as discussed with reference to FIG. 1B, followed by formation of the upper regions 108b in one or more subsequent conventional processes (e.g., additional conventional deposition processes and/or material removal processes). In other words, the lower region 108a may be formed in a first process and the upper regions 108b may be formed in a second, separate process.

In other embodiments, the lower region 108a and the upper regions 108b may be formed in one or more conventional processes including a single deposition process and a single material removal process. In such embodiments, the second passivation material 108 may be formed, following which portions thereof may be removed (e.g., patterned) using one or more conventional material removal processes (e.g., conventional photolithography processes, conventional etching processes). For example, a dielectric material may be formed over the first passivation material 106 and may be patterned by conventional photolithography techniques to form the lower region 108a and the upper regions 108b of the second passivation material 108. For instance, a photoresist material (not shown) may be formed over the dielectric material and patterned by conventional techniques, with the pattern in the photoresist material subsequently transferred to the dielectric material. A dry etch process may, for example, be used to form the upper regions 108b. Alternatively, the upper regions 108b may be formed using a photosensitive polyimide material that may be patterned and developed. Such formation and removal processes may result in formation of support structures (e.g., protrusions, ridges, lips, collars, etc.) of the upper regions 108b extending above (e.g., substantially transverse to) an upper surface of the lower region 108a of the second passivation material 108.

As shown in FIG. 1C, the upper regions 108b of the second passivation material 108 may be patterned and configured (e.g., sized, shaped, etc.) to facilitate placement of structures to be formed thereon. In particular, the upper regions 108b may include openings 112 configured to receive structures (e.g., structural elements) therein, to be discussed in greater detail with reference to FIG. 1D. Further, the upper regions 108b may be separated by intermediary regions 113 comprising an upper surface of lower region 108a and located between adjacent structures of the upper regions 108b. In other words, adjacent portions of the upper regions 108b of the second passivation material 108 may be spaced apart by the intermediary regions 113, as shown in FIG. 1C.

Figure 1D:
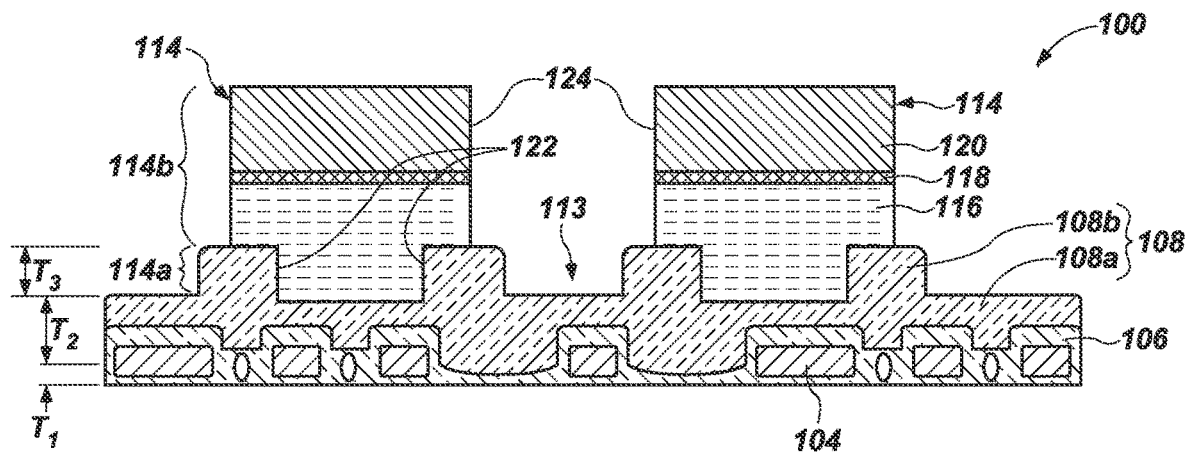

As shown in FIG. 1D, the apparatus 100 comprises one or more structural elements 114 in the form of a pillar, for example. The structural elements 114 may comprise thermally conductive elements and, incidentally, comprise an electrically conductive material, for example, a metal material. The structural elements 114 may be formed within at least some of the openings 112 in the second passivation material 108 and defined by upper regions 108b. In particular, the structural elements 114 may be vertically and laterally supported by the upper regions 108b of the second passivation material 108. As shown in FIG. 1D, lower portions 114a of the structural elements 114 may be positioned within (e.g., substantially laterally surrounded by) the upper regions 108b of the second passivation material 108, while upper portions 114b of the structural elements 114 may extend above an upper surfaces of the surrounding upper regions 108b without being laterally surrounded by the upper regions 108b. In other words, sidewalls 122 of the lower portions 114a of the structural elements 114 may be in direct physical contact with inner surfaces of the upper regions 108b, while sidewalls 124 of the upper portions 114b are entirely free of the second passivation material 108. Further, the upper portions 114b may exhibit a greater lateral extent than that of the lower portions 114a in some embodiments. In other words, the sidewalls 124 of the upper portions 114b may extend laterally beyond the sidewalls 122 of the lower portions 114a, such that the upper portions 114b overlay and are vertically supported by the upper regions 108b. In other embodiments, the lower portions 114a may have substantially the same diameter as that of the upper portions 114b, such that the sidewalls 122, 124 are substantially coplanar with one another and the upper portions 114b are laterally adjacent the upper regions 108b without overlying portions thereof. In either case, any stress applied by structural elements 114 is substantially distributed over the lower region 108a and the upper regions 108b of the second passivation material 108.

As discussed in greater detail with reference to FIG. 1C, portions of the second passivation material 108 may exhibit a substantially planar upper boundary, and a non-planar lower boundary partially defined by the topography of the surface of the first passivation material 106 and separated from the upper boundary. Thus, the lower region 108a of the second passivation material 108 may have a thickness sufficient to substantially smooth out the underlying uneven topography of the conductive segments 104 (e.g., smooth out abrupt topography changes between adjacent portions of the underlying conductive segments 104). In other words, portions of the lower region 108a of the second passivation material 108 may intervene between laterally adjacent portions of the conductive segments 104 and fill (e.g., substantially completely fill) recessed regions between the laterally adjacent portions of the first passivation material 106 over conductive segments 104.

Figure 10:
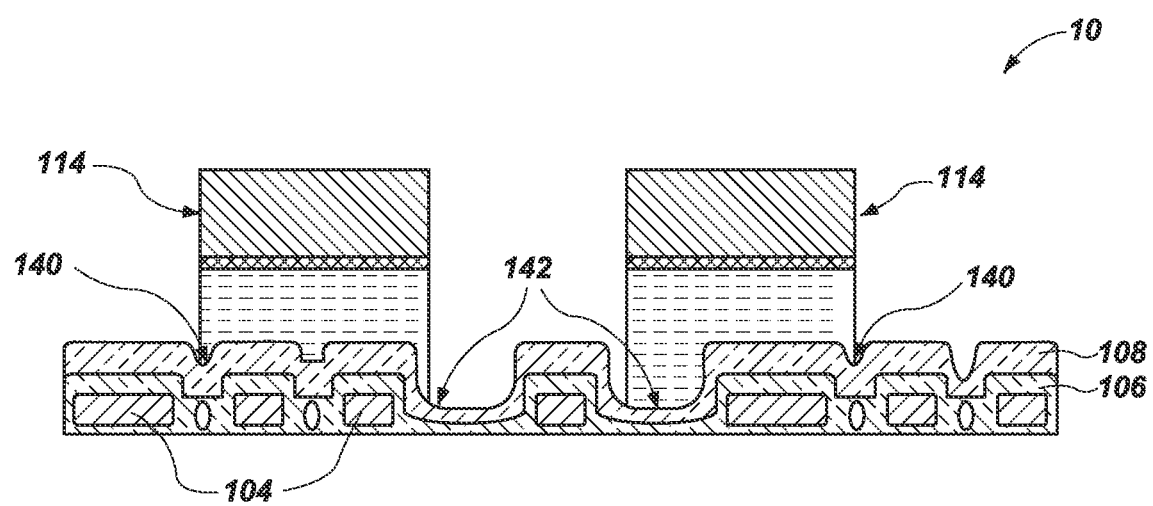
FIG. 10 is a simplified, partial cross-sectional view of an exemplary microelectronic device.

FIG. 10 shows a simplified, partial cross-sectional view of a conventional apparatus 10. In contrast to the apparatus 100 of FIG. 1D, the apparatus 10 of FIG. 10 shows the second passivation material 108 (if present) being formed conformally over the first passivation material 106 and the underlying conductive segments 104 using conventional deposition processes and durations. In such embodiments, the second passivation material 108 is not formed to a thickness sufficient to provide a flat surface above topography of the conductive segments 104 and distribute regions of high stress applied to the first passivation material 106 and the second passivation material 108 by the structural elements 114. In particular, lateral sidewalls of the structural elements 114 of the embodiment of FIG. 10 may be randomly aligned with the uneven topography of the second passivation material 108 such that high stress points develop within recessed regions (e.g., small valleys 140 and large valleys 142) between laterally adjacent portions of the conductive segments 104. Such random misalignment of the structural elements 114 relative to the conductive segments 104 may result in passivation cracking due to inadequate support of the structural elements 114 occasioned by lack of sufficient stress distribution. FIG. 10 and the accompanying description thereof in this specification are provided to enhance an understanding by one of ordinary skill in the art of embodiments of the disclosure, and are not admitted by the applicant as prior art for any purpose.

Returning to FIG. 1D, the second passivation material 108 of the apparatus 100, in contrast to that of the apparatus 10, may have a thickness sufficient to more evenly distribute (e.g., spread out) stress applied to the second passivation material 108 by the structural elements 114 to provide adequate support to the structural elements 114. For example, high stress points along the base of the structural elements 114 may be reduced (e.g., minimized) by increasing an effective surface area between the second passivation material 108 and the lower portions 114a of the structural elements 114 using the relatively thicker lower region 108a as well as the upper regions 108b. In particular, the first passivation material 106 may be formed to a first thickness $T_1$, the lower region 108a may be formed to a second thickness $T_2$ greater than the first thickness $T_1$, and the upper regions 108b may be formed to a third thickness $T_3$, as shown in FIG. 1D. In some embodiments, the second thickness $T_2$ may be greater than each of the first thickness $T_1$ and the third thickness $T_3$. In other embodiments, the third thickness $T_3$ may be greater than each of the first thickness $T_1$ and the second thickness $T_2$. Further, the second thickness $T_2$ of the lower region 108a and/or the third thickness $T_3$ of the upper regions 108b of the second passivation material 108 may be formed to be independent (e.g., entirely independent) or, alternatively, at least partially dependent on sizes and shapes of the conductive segments 104 (e.g., heights, widths, and/or lateral distances therebetween).

In some embodiments, the structural elements 114 may include solder bumps or solder balls. In other embodiments, the structural elements 114 may be individual pillars including a single conductive material, such as copper, or a conductive material capped by solder. For example, the structural elements 114 may comprise a conductive material 116 (e.g., copper), a barrier material 118 (e.g., a nickel material) thereover, and a solder material 120, such as a SnAg solder, over the barrier material 118, as shown in FIG. 1D. The conductive material 116 may be formed using a conventional electroplating process, for example, to a thickness (e.g., height) of between about 5 µm and about 15 µm. Further, the barrier material 118 may be formed (e.g., electroplated) to a thickness of between about 3 µm and about 5 µm. The barrier material 118 may be employed, in some embodiments, as a barrier layer to prevent formational of intermetallic compounds between the conductive material 116 and the tin of solder material 120. The solder material 120 may be formed (e.g., electroplated) to a thickness of between about 12 µm and about 15 µm, for example. Further, thicknesses of materials may be expressed relative to one another. By way of non-limiting example, a combined thickness of the first passivation material 106 and the second passivation material 108 may be between about 15 percent and about 70 percent of a thickness of the structural elements 114, such as between about 20 percent and about 50 percent. Stated another way, a combined thickness of the first passivation material 106 and the second passivation material 108 may be between about 1 µm and about 4 µm less than a thickness of the structural elements 114, for example.

One of ordinary skill in the art will appreciate, however, that respective thicknesses of each of the conductive material 116, the barrier material 118 and the solder material 120 of the structural elements 114 may correspond to the materials employed in fabrication of conductive elements to electrically interconnect stacked, TSV-equipped semiconductor dice and a substrate so that the conductive elements and structural elements may be formed using the same processes. The relative thicknesses of various materials employed in structural elements 114 are not limiting of implementation of embodiments of the disclosure, nor is it a requirement that structural elements 114 must necessarily be fabricated at the same time as the aforementioned structural elements.

The structural elements 114 may comprise a substantially circular cross-sectional (e.g., cylindrical) shape having a diameter of between about 10 µm and about 40 µm, such as between about 15 µm and about 30 µm, for example. In some embodiments, the structural elements 114 may have a diameter of about 20 µm. Further, specific requirements (e.g., materials, thicknesses, diameter, etc.) of the structural elements 114 may vary between structures of differing microelectronic devices. For example, semiconductor dice configured for use in a High Bandwidth Memory (HBM) device may include materials and/or dimensions of structural elements 114, as well as support structures (e.g., upper regions 108b of the second passivation material 108) designed to accommodate such memory devices.

While two structural elements 114 are shown in FIG. 1D for clarity, any number of structural elements 114 may be formed in a repeating pattern (e.g., an array). While each of the two structural elements 114 is shown as having a substantially circular cross-sectional shape, the structural elements 114 may have any suitable transverse cross-sectional shape such as, for example, a square cross-sectional shape, an elliptical cross-sectional shape, or a triangular cross-sectional shape. In some embodiments, the structural elements 114 may have a rectangular cross-sectional shape, such as slash marks or elongated bars, for example.

Alternatively or additionally, the conductive segments 104 may be configured (e.g., sized, shaped, and/or located) in predetermined patterns within the apparatus 100. In particular, while design of the conductive segments 104 (e.g., conductive traces and pads) is commonly governed by structural design and/or electrical performance of an individual circuit, the conductive segments 104 may be intentionally designed so as to be arranged in predetermined patterns within designated locations that are based, at least in part, on subsequent placement of the structural elements 114. In other words, a desired topography suitable for placement of the structural elements 114 may be obtained by selectively arranging the underlying conductive segments 104, such that the resulting topography provides enhanced structural support to the structural elements 114 by reducing or eliminating potential high stress points. By way of example and not limitation, regions that are more densely packed with the conductive segments 104 may be suitable locations for subsequent placement of at least some of the structural elements 114. In particular, the conductive segments 104 may be configured to be positioned under (e.g., in direct vertical alignment with) the structural elements 114 upon formation thereof to provide additional stability to the structural elements 114 and to avoid stress points between the conductive segments 104 that may result in cracking of the first passivation material 106 and/or the second passivation material 108. Further, the conductive segments 104 may be configured such that recessed regions between laterally adjacent portions of the conductive segments 104 are not in vertical alignment with lateral side surfaces of the structural elements 114. In addition, portions of the conductive segments 104 may be strategically positioned to be vertically aligned with the structural elements 114 for enhanced thermal conductivity therebetween, in addition to providing increased structural stability. In other words, at least some of the structural elements 114 may comprise thermal elements that are in direct vertical alignment with the underlying conductive segments 104 (e.g., cell plates). Further, thicknesses of the second passivation material 108 including the upper regions 108b thereof may be based, at least in part, on placement of the underlying conductive segments 104.

FIGS. 2A through 3B show the apparatus 100 after multiple process acts described above have been conducted. For example, the apparatus 100 includes the lower region 108a of the second passivation material 108 having a thickness sufficient to substantially smooth out underlying topography of the conductive segments 104 as well as patterned regions of the upper regions 108b thereof to provide adequate support to the structural elements 114. In particular, the differing thicknesses of the passivation materials, including the lower region 108a and the upper regions 108b of the second passivation material 108, provides an optimized thickness of the passivation materials such that stress points are reduced along the margins, for example, along an outer perimeter of bases of the structural elements 114 with minimal reduction in thermal conductivity. Further, as noted above, placement of the conductive segments 104 in predetermined patterns may be based at least in part on subsequent placement of the structural elements 114 in order to further reduce occurrences of passivation cracking.

Figure 2A:
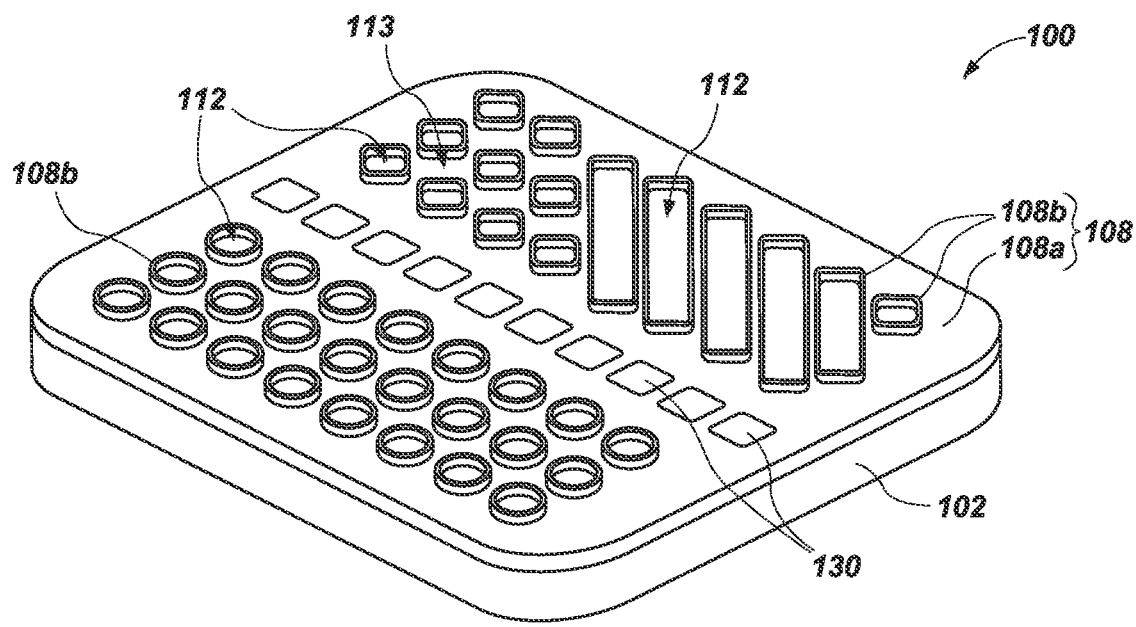
FIGS. 2A-2B are simplified, perspective views illustrating various stages of forming the microelectronic device of FIG. 1D in accordance with embodiments of the disclosure.
Figure 2B:
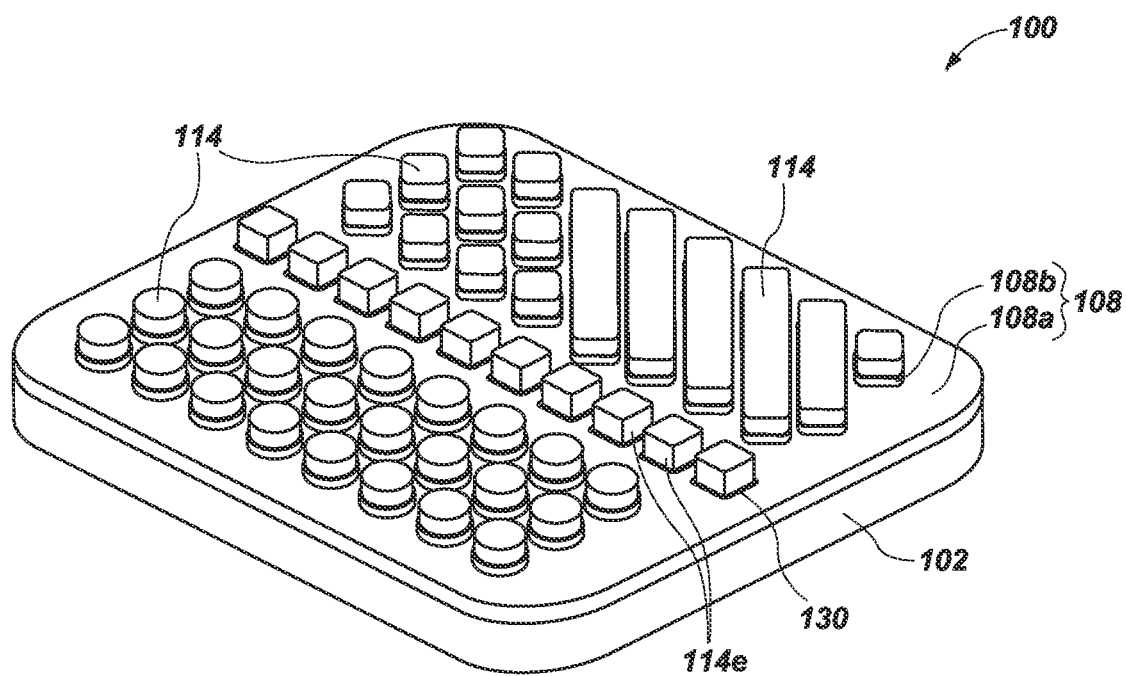

As shown in FIG. 2A in combination with FIG. 2B, the apparatus 100 comprises the second passivation material 108 overlying the base material 102. For clarity and convenience, the conductive segments 104 and the first passivation material 106 have been removed from the perspective views of FIGS. 2A and 2B (as well as from the perspective views of FIGS. 3A and 3B) although it is to be understood that the conductive segments 104 and the first passivation material 106 may be included in a fully assembled apparatus 100. Conductive pads 130 (e.g., probe pads, through-silicon via (TSV) pads, micro pad interconnect regions, etc.) may be formed on or over the base material 102 in one or more rows. As discussed above, portions of the materials (e.g., the second passivation material 108) may be removed (e.g., recessed) to expose portions of the conductive pads 130.

As shown in FIG. 2A, the lower region 108a of the second passivation material 108 may be of sufficient thickness to cover (e.g., substantially entirely cover) and smooth out the underlying uneven topography, such that portions of the second passivation material 108 may exhibit a substantially planar upper boundary (e.g., upper surface). As best shown in the perspective views of FIGS. 2A and 2B, the upper regions 108b of the second passivation material 108 may be patterned to accommodate placement of the structural elements 114. For example, the openings 112 may be defined within portions of the upper regions 108b that are configured (e.g., sized and shaped) to receive the structural elements 114, as shown in FIG. 2B. Further, the upper regions 108b may be separated by the intermediary regions 113 located between adjacent portions thereof. Further, placement of the structural elements 114 may be based, at least in part, on placement of features within the apparatus 100. For example, at least some of the structural elements 114 may include thermal pillars as well as substantially mechanical support pillars positioned flanking a central region (e.g., spine) of the base material 102 to provide one or more of enhanced thermal conductivity, uniform support, and bond line linearity when components are stacked. In other words, an increased number (e.g., higher concentrations) of the structural elements 114 may be positioned within or proximate to regions prone to excessive heat generation, warpage, or both. At least some of the structural elements 114 may include thermal pillars overlying (e.g., in direct vertical alignment with) the conductive segments 104 while being electrically isolated from circuitry (e.g., upper metal portions, bond pads, etc.) thereof. In embodiments, the structural elements 114 are of the same height and comprise the same material or materials as conductive elements 114e (e.g., electrical pillars) positioned on or over the conductive pads 130 to provide electrical connection to circuitry of the apparatus 100, as shown in FIG. 2B.

In some embodiments, the upper regions 108b may each be formed to comprise a substantially circular cross-sectional (e.g., annular) shape, as shown in the lower, left-hand portion of the perspective view of FIG. 2A. In such embodiments, an inner diameter of the upper regions 108b may be sized and shaped to correspond to an outer diameter of the lower portions 114a (FIG. 1D) of the structural elements 114 having a substantially cylindrical cross-sectional shape with an outer diameter of the structural element being between the inner and outer diameters of the upper regions 108b, for example. In other embodiments, the upper regions 108b may be formed to comprise a substantially square outer cross-sectional shape, as shown in the upper, right-hand portion of FIG. 2A. In such embodiments, individual portions of the upper regions 108b may be discrete and separated by the intermediary regions 113 or, alternatively, individual portions of the upper regions 108b may be continuous (e.g., without separation) in a lattice-shaped structure, for example. In yet other embodiments, the upper regions 108b may be formed to comprise a substantially rectangular cross-sectional shape in the form of an elongated bar, as shown in the lower, right-hand portion of FIG. 2A. Further, a longitudinal axis of such elongated bars may be oriented at an acute angle (e.g., a 45-degree angle) with respect to a longitudinal axis of one or more rows of the conductive pads 130, as shown in FIG. 2A. While the apparatus 100 is illustrated in FIGS. 2A and 2B as comprising an assortment of shapes and sizes of the upper regions 108b, it may be understood that such an assortment is shown for illustrative purposes only and that any configuration of the apparatus 100 including patterns of the upper regions 108b may include uniform sizes and shapes.

Further, the features and feature configurations (e.g., shapes) described above in relation to FIGS. 2A and 2B may be adapted to design needs of specific microelectronic devices (e.g., memory devices). In particular, FIGS. 3A and 3B show simplified, perspective views of the apparatus 100 having a different configuration than that depicted in FIGS. 2A and 2B.

Figure 3A:
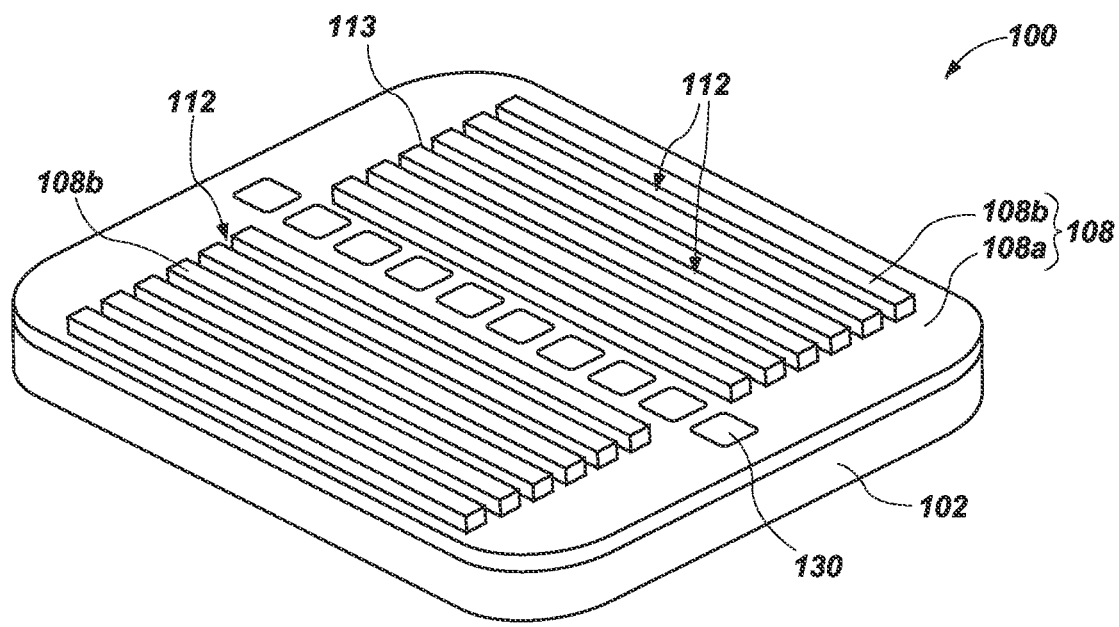
FIGS. 3A-3B are simplified, perspective views illustrating various stages of forming the microelectronic device of FIG. 1D in accordance with additional embodiments of the disclosure.
Figure 3B:
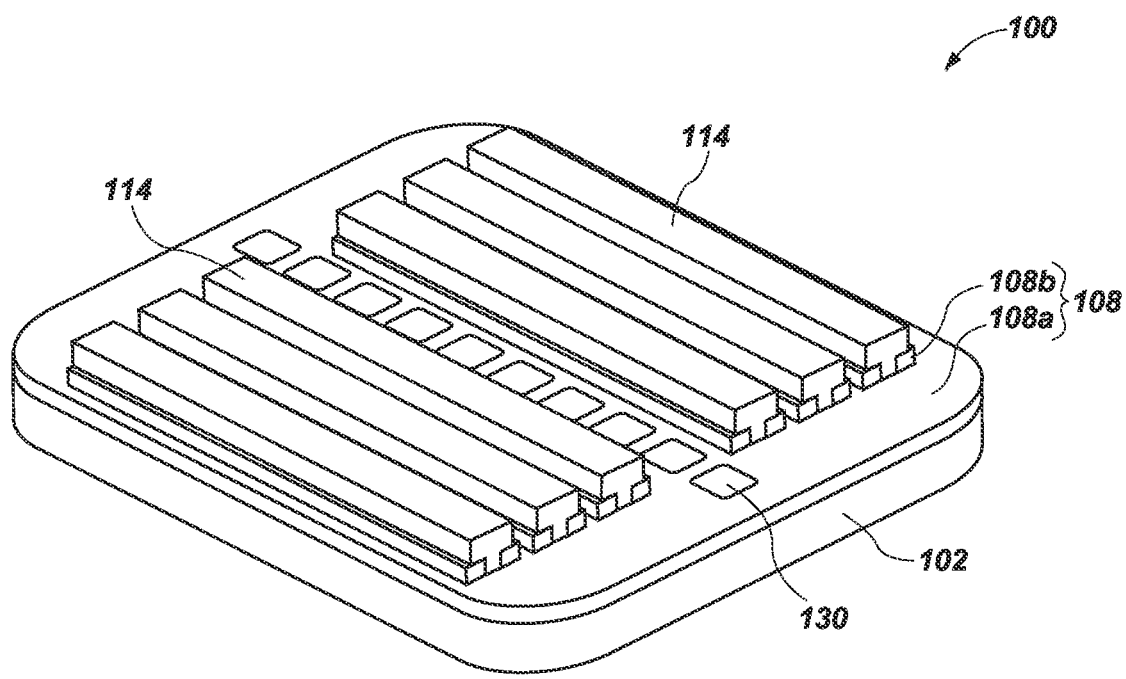

As shown in FIG. 3A in combination with FIG. 3B, the apparatus 100 similarly comprises the second passivation material 108 overlying the base material 102 and the conductive pads 130 formed thereover in one or more rows. Similarly, the lower region 108a of the second passivation material 108 may be of sufficient thickness to cover (e.g., substantially entirely cover) and smooth out the underlying uneven topography, such that portions of the second passivation material 108 may exhibit a substantially planar upper boundary (e.g., upper surface). As shown in the perspective views of FIGS. 3A and 3B, the upper regions 108b may also be patterned to accommodate placement of the structural elements 114. In particular, the upper regions 108b may be formed to comprise a substantially rectangular cross-sectional shape. In such embodiments, pairs of parallel elongated bars of the rectangular-shaped portions of the upper regions 108b may be separated by the intermediary regions 113 located between adjacent pairs and having the openings 112 between two adjacent elongated bars of the upper regions 108b. In other words, elongated bars of the structural elements 114 may be supported on opposing sides by elongated segments of the second passivation material 108. Further, a longitudinal axis of the elongated bars of the upper regions 108b may be oriented substantially parallel to the longitudinal axis of the one or more rows of the conductive pads 130, as shown in FIG. 3A. Alternatively, the longitudinal axis of the elongated bars of the structural elements 114 may be oriented substantially transverse (e.g., perpendicular) to the longitudinal axis of the one or more rows of the conductive pads 130 or oriented at an acute angle thereto. As in the previous embodiments, the structural elements 114 may be formed within the openings 112 of the upper regions 108b and extend above the openings 112 and at least partially laterally over the adjacent elongated bars of the upper regions 108b, as shown in the perspective view of FIG. 3B. Thus, the structural elements 114 may be elongated, continuous portions in the embodiment of FIGS. 3A and 3B. To complete formation of the apparatus 100 including the patterned regions of the second passivation material 108, additional materials may be formed on or over the second passivation material 108, the structural elements 114, and/or the conductive pads 130 by conventional techniques, which are not described in detail herein.

Numerous advantages are achieved by utilizing the process described above to form the apparatus 100. By utilizing patterned support structures of the upper regions 108b of the second passivation material 108, increased reliability may be achieved by providing enhanced adhesion of and support for the structural elements 114 as well as by reducing passivation cracking. For example, stress risers (e.g., locations of concentrated stress) along the base of the structural elements 114, may be reduced by increasing an effective surface area between the second passivation material 108 and the lower portions 114a of the structural elements 114 using the upper regions 108b. Thus, force may be more evenly distributed (e.g., equalized) around a perimeter and along sidewalls of the structural elements 114, resulting in potential stress points being raised well above a potentially damaging level. In addition, thermal performance may be improved by enabling placement of the structural elements 114 (e.g., thermal pillars) over designated locations within the apparatus 100 (e.g., over cell plates) without consideration of underlying topography. Alternatively or additionally, the conductive segments 104 may be positioned in predetermined patterns based at least in part on subsequent placement of the structural elements 114 in order to further reduce occurrences of passivation cracking. Further, formation of materials (e.g., the second passivation material 108) having specific thicknesses to provide a planar surface above base material 102 of apparatus 100 may provide simplified fabrication processes to enhance the planarity among the structural elements 114, for example. In particular, structural elements 114 may be more repeatably processed (e.g., electroplated) at the same time to reliably achieve a coplanar profile, resulting in a more linear bondline.

Accordingly, a method of forming a microelectronic device is disclosed. The method comprises forming mutually spaced conductive segments, forming a first passivation material having a first thickness adjacent the conductive segments, and forming a second passivation material having a second, greater thickness adjacent the first passivation material. The second passivation material may have a thickness sufficient to provide a substantially flat surface above at least a portion of an uneven topography associated with the mutually spaced conductive segments protruding above an upper surface of underlying materials. The method also comprises forming a patterned surface structure in upper regions of the second passivation material, and forming structural elements adjacent the second passivation material. The structural elements may be vertically and laterally supported by the patterned surface structure of the second passivation material.

Accordingly, an apparatus comprises conductive segments comprising an uneven topography comprising upper surfaces of the conductive segments protruding above an upper surface of underlying materials, a first passivation material substantially conformally overlying the conductive segments, and a second passivation material overlying the first passivation material. The second passivation material is relatively thicker than the first passivation material. The apparatus also comprises structural elements overlying the second passivation material. The second passivation material has a thickness sufficient to provide a substantially flat surface above the uneven topography of the underlying conductive segments at least in regions supporting the structural elements.

One of ordinary skill in the art will appreciate that, in accordance with additional embodiments of the disclosure, the features and feature configurations described above in relation to FIGS. 1A through 3B may be adapted to design needs of different microelectronic devices (e.g., different memory devices). By way of non-limiting example, in accordance with additional embodiments of the disclosure, FIGS. 4A through 7B show simplified, partial cross-sectional views and simplified, perspective views of an apparatus having a different configuration than the previous apparatus 100. Throughout the remaining description and the accompanying figures, functionally similar features (e.g., structures, devices) are referred to with similar reference numerals. To avoid repetition, not all features shown in the remaining figures (including FIGS. 4A through 7B) are described in detail herein. Rather, unless described otherwise below, a feature designated by a reference numeral of a previously-described feature (whether the previously described feature is first described before the present paragraph, or is first described after the present paragraph) will be understood to be substantially similar to the previously described feature.

Figure 4A:
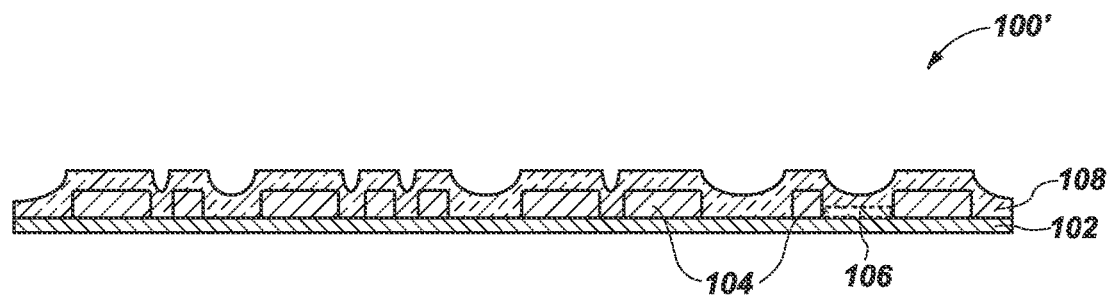
FIGS. 4A-4C are simplified, partial cross-sectional views illustrating various stages of forming a microelectronic device in accordance with additional embodiments of the disclosure.

Formation of an apparatus 100' including conductive segments 104 formed adjacent (e.g., on or over) the base material 102 (e.g., a semiconductor die) is shown in FIG. 4A. In some embodiments, the first passivation material 106 may, optionally, be formed adjacent to (e.g., vertically adjacent to and/or laterally adjacent to) at least a portion of the conductive segments 104 and the base material 102, similar to the apparatus 100 described above and depicted in FIG. 1A. Further, the second passivation material 108 may be formed adjacent the first passivation material 106, if present. In such embodiments, each of the first passivation material 106 and the second passivation material 108 may be formed of and include at least one dielectric material including, but not limited to, an oxide, a nitride, or an oxynitride or, alternatively, may be formed of a polyimide material. The second passivation material 108 may be formed of the same material as or formed of a different material from the first passivation material 106. By way of non-limiting example, the second passivation material 108 may be a nitride material (e.g., a silicon nitride or silicon oxynitride material) and the first passivation material 106 may be an oxide material (e.g., a silicon oxide material).

As in the previous embodiment, the second passivation material 108 may be formed adjacent (e.g., on or over) exposed surfaces of the first passivation material 106 in some embodiments. A thickness of the second passivation material 108 may be greater (e.g., substantially greater) than a thickness of the underlying first passivation material 106, as discussed above in greater detail with reference to FIGS. 1B and 1D. In particular, the second passivation material 108 may at least partially (e.g., substantially) cover upper surfaces of the first passivation material 106 and extend from and between side surfaces (e.g., sidewalls) of the first passivation material 106 as well as over horizontal surfaces of the first passivation material 106. In such embodiments, the second passivation material 108 may be of a sufficient thickness to cover (e.g., substantially entirely cover) and smooth out the underlying topography, such that portions of the second passivation material 108 may exhibit a substantially planar upper boundary (e.g., a substantially flat upper surface) at least in regions supporting the structural elements 114, such as, for example, in regions proximate to, immediately adjacent to, or directly underlying the structural elements 114.

Alternatively, as shown in FIG. 4A, the second passivation material 108 of the present embodiment may be formed to have a lesser thickness, similar to that of the first passivation material 106. In other words, the second passivation material 108 of the apparatus 100' may be formed using one or more conventional deposition processes, such as one or more of a conventional ALD process and a conventional CVD process. Further, the second passivation material 108 may not include upper and lower regions (e.g., patterned regions) thereof in such embodiments. Rather, upper surfaces of the second passivation material 108 may exhibit a topography generally or in part similar to (e.g., based at least in part on) the underlying topography of the conductive segments 104, as shown in FIG. 4A. In yet other embodiments, the apparatus 100' may include only one (e.g., a single) passivation material (e.g., the first passivation material 106 or the second passivation material 108) shown in subsequent figures, for illustrative purposes, as the second passivation material 108.

Figure 4B:
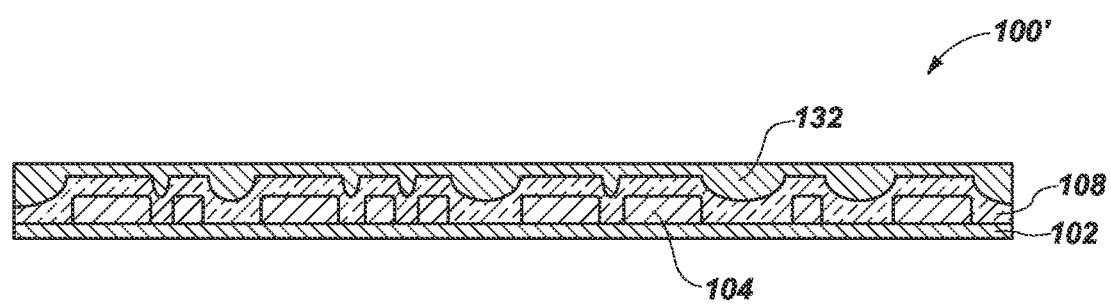

As shown in FIG. 4B, a base plate 132 may be formed adjacent (e.g., on or over) exposed surfaces of the passivation materials (e.g., the first passivation material 106 and/or the second passivation material 108) of the apparatus 100'. As shown in FIG. 4B, the base plate 132 may at least partially (e.g., substantially) fill in and smooth a topography defined by the surfaces (e.g., upper surfaces, side surfaces) upon which the base plate 132 is formed. In some embodiments, the base plate 132 may be formed over the first passivation material 106 and may be used in lieu of the second passivation material 108 to fill in and smooth the underlying topography. In other words, the base plate 132 may at least partially (e.g., substantially) cover upper surfaces of the first passivation material 106 and extend from and between side surfaces (e.g., sidewalls) of the first passivation material 106 as well as over horizontal surfaces of the first passivation material 106. In some embodiments, the base plate 132 may be in direct physical contact with the first passivation material 106. In other embodiment, intervening materials (e.g., barrier materials, seed materials, etc.) may be located between the first passivation material 106 and the base plate 132. Further, the base plate 132 may form a substantially continuous, flat material surface over designated regions of the first passivation material 106 or the second passivation material 108, if present. In other words, an upper surface of the base plate 132 may be substantially smooth and even, without marked (e.g., pronounced) protrusions and/or indentations. By way of non-limiting example, the upper surface of the base plate 132 may have a surface roughness between about 15 nm and about 100 nm, such as between about 50 nm and about 100 nm, or between about 25 nm and about 50 nm, root mean square (RMS).

Figure 4C:
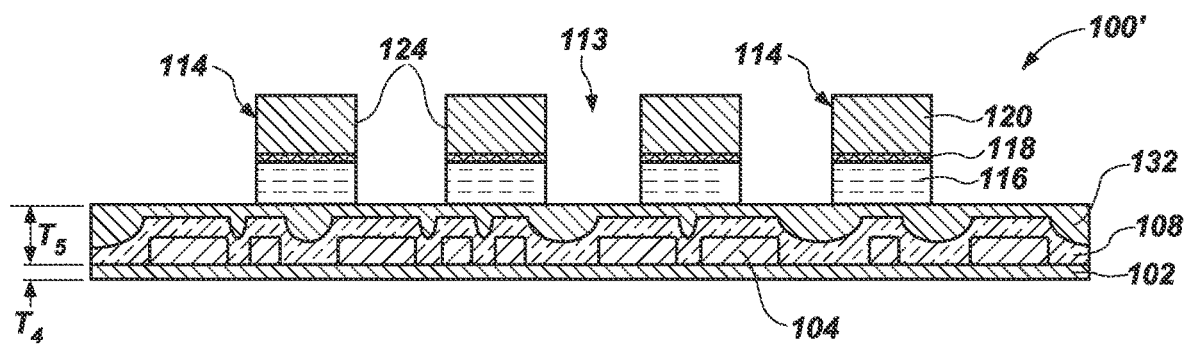

The base plate 132 may be formed to exhibit any desirable thickness. By way of non-limiting example, the base plate 132 may be formed to a thickness (e.g., average thickness) of between about 0.5 µm and about 2.5 µm, such as between about 0.75 µm and about 2 µm, or between about 1 µm and about 1.5 µm. In some embodiments, the base plate 132 may be formed to a thickness of about 1 µm or about 2 µm. Further, a combined thickness of the first passivation material 106, if present, the second passivation material 108, and the base plate 132 may be between about 1 µm and about 5 µm, for example. In some embodiments, the thickness (e.g., average thickness) of the second passivation material 108 may be relatively less than the thickness (e.g., average thickness) of the base plate 132. In particular, the second passivation material 108 may be formed to a fourth thickness $T_4$ and the base plate 132 may be formed to a fifth thickness $T_5$, as shown in FIG. 4C. In some embodiments, the fifth thickness $T_5$ may be greater than the fourth thickness $T_4$. In other embodiments, the fourth thickness $T_4$ may be greater than the fifth thickness $T_5$. Further, the fourth thickness $T_4$ of the second passivation material 108 and/or the fifth thickness $T_5$ of the base plate 132 may be formed to be independent (e.g., entirely independent) or, alternatively, at least partially dependent on sizes and shapes of the conductive segments 104, including, for example, heights, widths, and lateral distances between laterally adjacent portions thereof.

The base plate 132 may be formed of and include a metal, a metal alloy, or a metal-containing material. The base plate 132 may include, but is not limited to, aluminum, copper, gold, iridium, iridium oxide, molybdenum, molybdenum nitride, nickel, platinum, ruthenium, ruthenium oxide, ruthenium titanium nitride, silver, tantalum, tantalum nitride, tantalum silicide, titanium, titanium nitride, titanium silicide, titanium aluminum nitride, titanium silicon nitride, tungsten, tungsten nitride, tungsten silicide, alloys thereof, or combinations thereof.

The base plate 132 may be formed using conventional processes (e.g., conventional deposition processes, conventional material removal processes) and conventional processing equipment, which are not described in detail herein. For example, the base plate 132 may be formed (e.g., electroplated) on a seed material located on or over portions of the exposed surfaces of the apparatus 100'. In some embodiments, the base plate 132 may be subjected to at least one conventional material removal process. For instance, a photoresist material (not shown) may be formed over the conductive material as deposited, and patterned by conventional techniques, with the pattern in the photoresist material subsequently transferred to the conductive material and the remainder removed. Alternatively, a photoresist material may be formed over the seed material and patterned to expose areas to be electroplated, the photoresist and seed material then subsequently being removed. In such embodiments, portions of the base plate 132 may exhibit a substantially planar upper boundary (e.g., upper surface), and a non-planar lower boundary partially defined by the topography of the surface (e.g., upper surface) of the second passivation material 108.

As shown in FIG. 4C, the apparatus 100' comprises one or more (e.g., an array) of the structural elements 114 in the form of a pillar or a solder bump, for example. As in the previous embodiments, the structural elements 114 may comprise electrically conductive elements, thermally conductive elements, mechanical structures, or a combination thereof. In some embodiments, at least some of the structural elements 114 may be a pillar comprising the conductive material 116, the barrier material 118, and/or the solder material 120, for example, as discussed in greater detail with reference to FIG. 1D. Further, the structural elements 114 may be formed of the same material as or formed of a different material from the base plate 132. By way of non-limiting example, the structural elements 114 may comprise the conductive material 116 (e.g., a copper material) underlying the barrier material 118 and the solder material 120 and the base plate 132 may comprise the same conductive material (e.g., the copper material) as that of the lowermost material of the structural elements 114. Alternatively, the structural elements 114 may comprise a first conductive material (e.g., a copper material) and the base plate 132 may comprise a second, different conductive material (e.g., a nickel material). Further, the structural elements 114 may be physically connected to the base plate 132. In some embodiments, the structural elements 114 may be in direct physical contact with the base plate 132. In other embodiments, one or more intervening materials (e.g., barrier materials) may be located between a bottom surface of the structural elements 114 and an upper surface of the base plate 132.

In some embodiments, the base plate 132 may be formed in one or more conventional processes followed by formation of the structural elements 114 in one or more additional processes (e.g., conventional deposition processes and/or material removal processes). In other words, the base plate 132 may be formed in a first process and the structural elements 114 may be formed in a second, separate process, for example, concurrently with the formation of conductive elements to electrically interconnect the semiconductor die with other components. Alternatively, the base plate 132 and the structural elements 114 may be formed in one or more conventional processes including a single deposition process followed by one or more material removal processes, for example. In such embodiments, a conductive material may be formed at an initial thickness that is greater than a final combined thickness of the base plate 132 and the structural elements 114. Thereafter, portions of the conductive material may be removed (e.g., patterned) using one or more conventional material removal processes (e.g., conventional photolithography processes, conventional etching processes). Such formation and/or removal processes (e.g., patterning and etching processes) may result in formation of the base plate 132 underlying the structural elements 114 extending above (e.g., substantially transverse to) an upper surface of the base plate 132. Alternatively, the base plate 132 may be formed, as by electroplating, and then masked to selectively expose portions of the base plate 132 for additional electroplating. In some embodiments, a thickness (e.g., average thickness) of the structural elements 114 may be relatively greater than a thickness (e.g., average thickness) of the base plate 132. In other embodiments, the thickness (e.g., average thickness) of the structural elements 114 may be relatively less than or, alternatively, equal to the thickness (e.g., average thickness) of the base plate 132.

As in the previous embodiment, the structural elements 114 may comprise a substantially circular cross-sectional shape or, alternatively, the structural elements 114 may comprise any one of, or a combination of, a square cross-sectional shape, an elliptical cross-sectional shape, a triangular cross-sectional shape, or a rectangular cross-sectional shape (e.g., slash marks or elongated bars). Further, the structural elements 114 located adjacent one another may be separated by the intermediary regions 113. However, rather than being adjacent to and being supported by portions of the second passivation material 108, the structural elements 114 may be adjacent to and be only supported by the base plate 132.

FIGS. 5A through 7B show the apparatus 100' after multiple process acts described above have been conducted. For example, the apparatus 100' includes the base plate 132 having a thickness sufficient to substantially smooth out underlying topography of the second passivation material 108 and the conductive segments 104 to provide adequate support to the structural elements 114. In particular, portions of the base plate 132 may intervene between laterally adjacent portions of the conductive segments 104. In some embodiments, the base plate 132 may fill (e.g., substantially completely fill) recessed regions between the laterally adjacent portions of the conductive segments 104. In other words, a bottom surface of the base plate 132 may conform to topography of the conductive segments 104. Further, the base plate 132, in combination with or in lieu of, the second passivation material 108, provides an optimized thickness of the materials such that stress points are reduced along the margins, for example, along an outer perimeter of bases of the structural elements 114 with minimal reduction in electrical and/or thermal conductivity. Further, placement of the conductive segments 104 in predetermined patterns may be based at least in part on subsequent placement of the structural elements 114 and/or the base plate 132 in order to further reduce occurrences of passivation cracking.

Figure 5A:
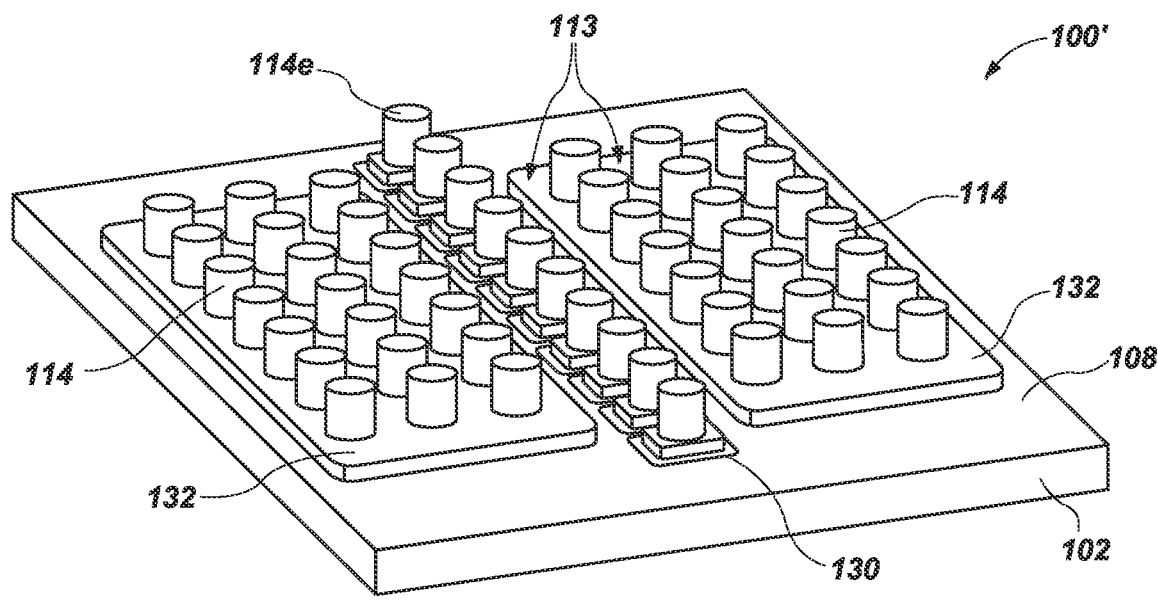
FIGS. 5A-5D are simplified, perspective views of the microelectronic device of FIG. 4C in accordance with additional embodiments of the disclosure.
Figure 5B:
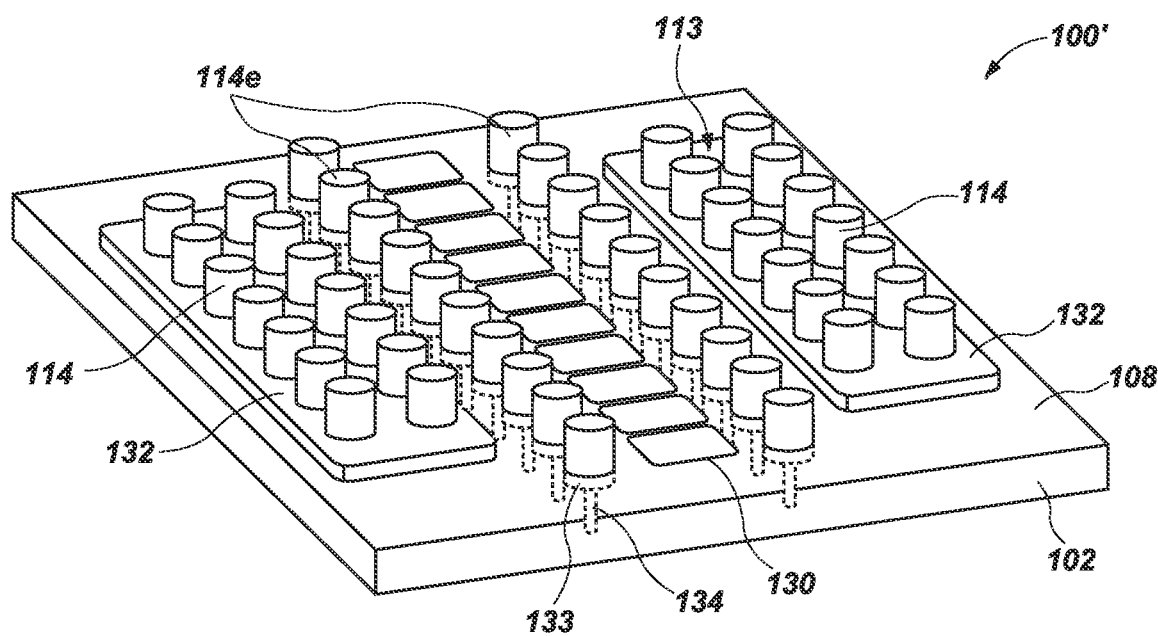

As shown in FIG. 5A in combination with FIG. 5B, the apparatus 100' comprises the second passivation material 108 overlying the base material 102. For clarity and convenience, the conductive segments 104 and the first passivation material 106 have been removed from the perspective views of FIGS. 5A and 5B (as well as from the perspective views of FIGS. 5C through 6B and the partial cross-sectional views of FIGS. 7A and 7B) although it is to be understood that the conductive segments 104 and, optionally, the first passivation material 106 may be included in a fully assembled apparatus 100'.

One or more of the base plates 132 may be located on or over the second passivation material 108 with the structural elements 114 located over the base plates 132, as shown in the laterally flanking regions of FIGS. 5A and 5B. In some embodiments, the conductive elements 114e for electrically connecting to other components may be located adjacent (e.g., on or over) at least some of the conductive pads 130, as shown in the central region of FIG. 5A. Further, the conductive elements 114e may, similarly be located on or over contacts 133 (e.g., live contacts), as shown in FIG. 5B. The contacts 133 may be physically and electrically connected to electrical interconnects 134 (TSVs) underlying the contacts 133 and extending through (e.g., entirely through) the base material 102 of the semiconductor die. The structural elements 114 may be separated from one another by the intermediary regions 113 and may be located on or over an upper surface of the base plates 132. The base plates 132 may entirely cover an upper surface (e.g., an active surface) of a respective tier (e.g., die, interposer, etc.) of the apparatus 100' or, alternatively, the base plates 132 may be located within designated regions corresponding to locations of the structural elements 114. In particular, the base plates 132 may be located within designated locations to provide additional support to the structural elements 114, as well as providing enhanced heat transfer and/or warpage control to the apparatus 100'. In some embodiments, the base plates 132 may comprise continuous sheets of material having a surface area of an upper surface that is relatively greater than a surface area of a bottom surface of the structural elements 114. In other embodiments, the base plates 132 may comprise discrete portions physically and/or electrically separated from one another. In other words, the base plates 132 may include discrete portions corresponding to individual conductive elements 114e for electrical interconnects, as shown, by way of non-limiting example, in a central region of the apparatus 100' of FIG. 5A corresponding in height and composition to structural elements 114. In such embodiments, lateral side surfaces of at least some of the base plates 132 may be the same as or, alternatively, extend a greater distance than lateral side surfaces of the structural elements 114.

Figure 5C:
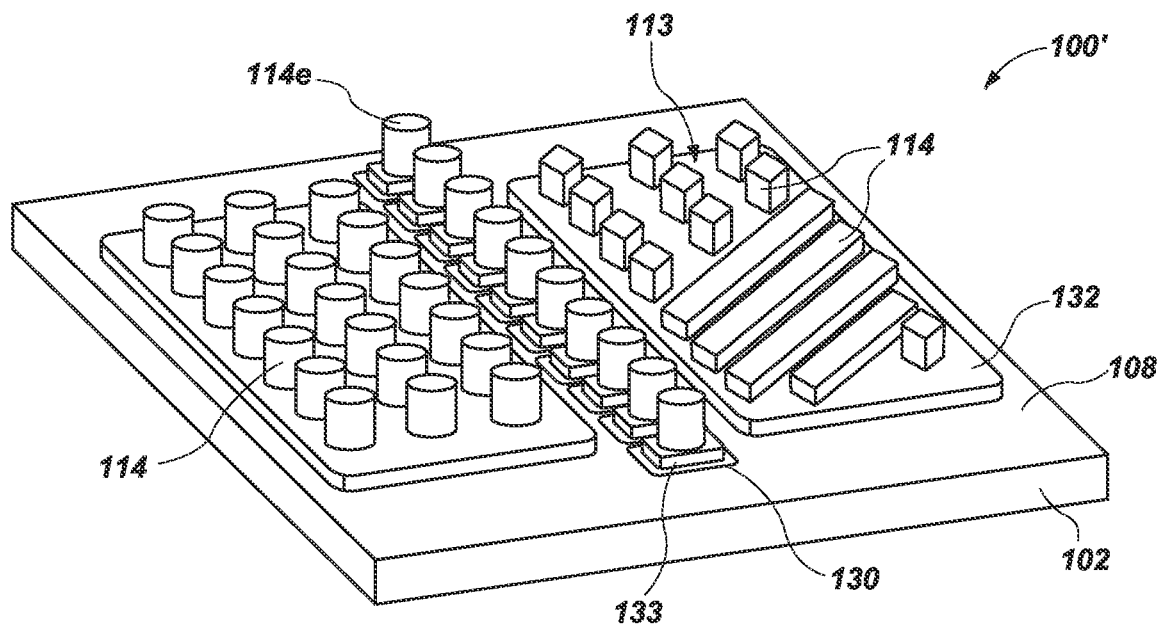
Figure 5D:
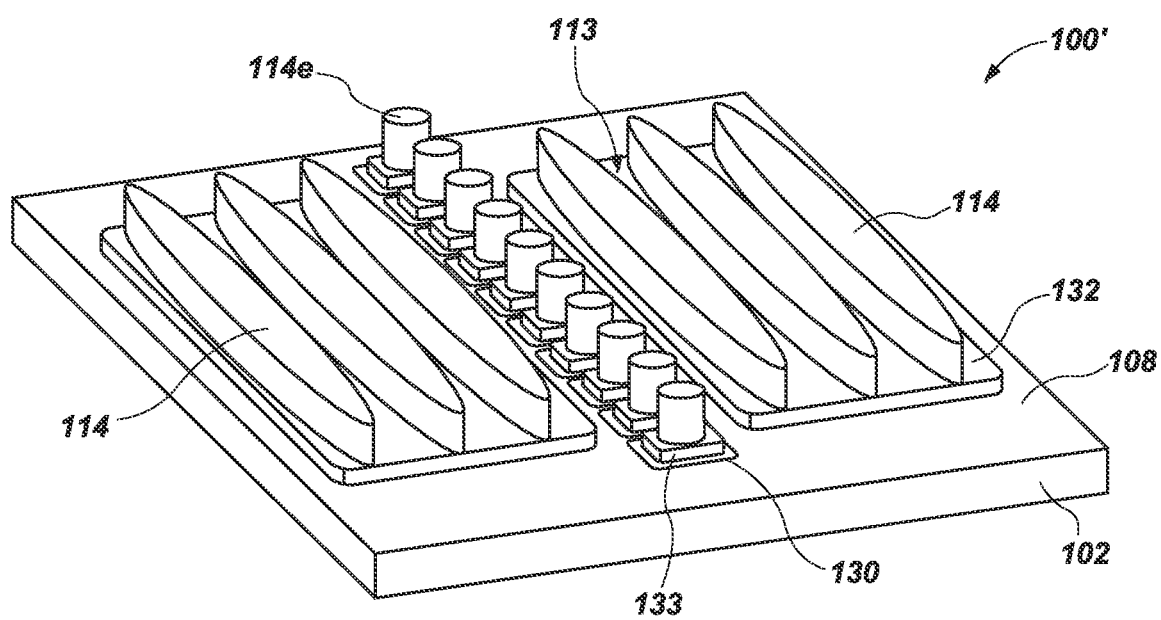

As shown in FIG. 5C in combination with FIG. 5D, configurations (e.g., sizes, shapes, etc.) of the structural elements 114 overlying the base plates 132 may be selected based on design needs of the apparatus 100'. In particular, the structural elements 114 may be formed to comprise a substantially circular cross-sectional shape, as shown in the lower, left-hand portion of the perspective view of FIG. 5C, a substantially square cross-sectional shape, as shown in the upper, right-hand portion of FIG. 5C, or a substantially rectangular cross-sectional shape in the form of an elongated bar, as shown in the lower, right-hand portion of FIG. 5C. Similar to the previous embodiments described with reference to FIG. 2A, slash marks or elongated bars may be discrete and/or continuous with portions thereof being separated by the intermediary regions 113. While the apparatus 100' is illustrated in FIG. 5C as comprising an assortment of shapes and sizes of the structural elements 114, it may be understood that such an assortment is shown for illustrative purposes only and that any configuration of the apparatus 100' including patterns of the structural elements 114 may include uniform sizes and shapes. Further, the conductive elements 114e corresponding in composition and height to structural elements 114 may be located on or over the contacts 133, as shown in FIGS. 5C and 5D. The contacts 133 may be physically and electrically connected to the conductive pads 130 (e.g., bond pads) underlying the contacts 133.

As shown in FIG. 5D, the rectangular-shaped portions of the structural elements 114 may be continuous along rows separated by the intermediary regions 113 located between adjacent rows of elongated bars thereof. The elongated bars may be substantially elliptical (e.g., having rounded ends) or substantially rectangular (e.g., having squared corners). Further, a longitudinal axis of the elongated bars of the structural elements 114 may be oriented substantially parallel to the longitudinal axis of the one or more rows of the conductive pads 130, as shown in FIG. 5D. Alternatively, the longitudinal axis of the elongated bars of the structural elements 114 may be oriented substantially transverse (e.g., perpendicular) to the longitudinal axis of the one or more rows of the conductive pads 130 or oriented at an acute angle thereto. Alternatively, the structural elements 114 may be formed in alternative patterns (e.g., L-shaped patterns, polygons, etc.).

Further, the features and feature configurations (e.g., shapes) described above in relation to FIGS. 5A through 5D may be adapted to design needs of specific microelectronic devices (e.g., memory devices). In particular, FIGS. 6A and 6B and 7A and 7B show simplified, perspective views of the apparatus 100' having a different configuration than that depicted in FIGS. 5A through 5D.

Figure 6A:
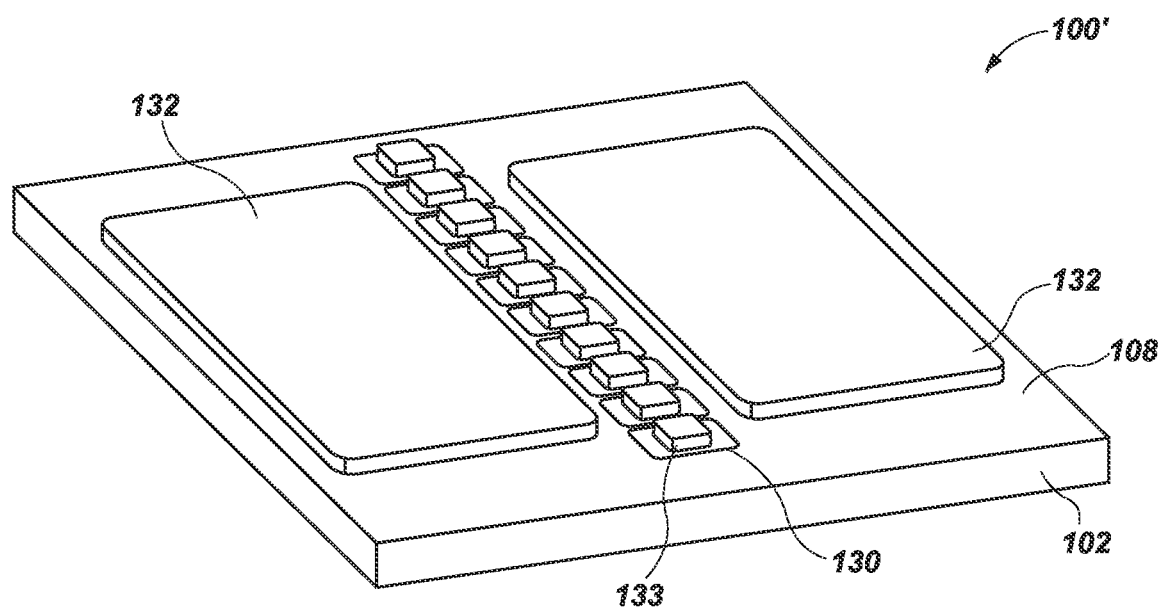
FIGS. 6A-6B are simplified, perspective views of the microelectronic device of FIG. 4C in accordance with additional embodiments of the disclosure.
Figure 6B:
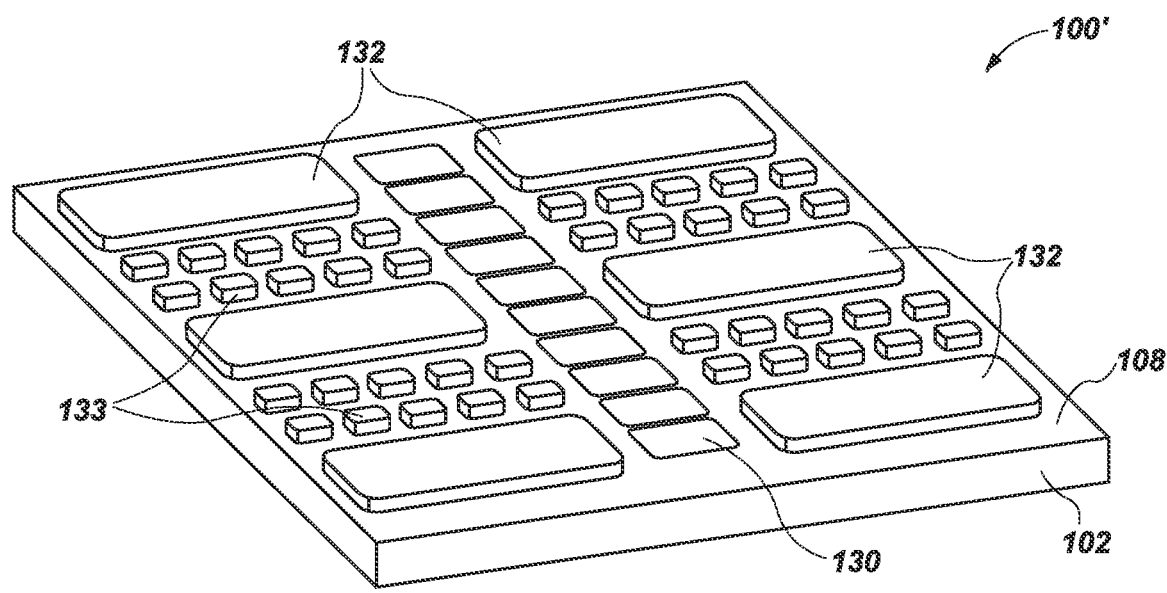

As shown in FIGS. 6A and 6B, the base plates 132 of the apparatus 100' may be located over the second passivation material 108, similar to the previous embodiments of FIGS. 5A through 5D. Further, the contacts 133 of the same height as the base plates 132 for electrical connections may be located over at least some of the conductive pads 130 (e.g., bond pads). However, the base plates 132 and/or the contacts 133 in the present embodiments of FIGS. 6A and 6B, are absent (e.g., entirely absent) the structural elements 114 (shown in FIG. 4C). In such an embodiment, the base plates 132 may be configured to be in physical contact with interconnects (e.g., additional base plates 132 and/or structural elements 114) of adjacent apparatus 100' in a stack upon assembly. The base plates 132 may comprise electrically and/or thermal conductive materials, such as copper, for example. By way of non-limiting example, the base plates 132 of adjacent apparatus 100' may be connected using copper-to-copper diffusion bonds in one or more conventional thermocompression bonding processes. In particular, the base plates 132 may be bonded during thermocompression bonding of electrical connections in the form of contacts 133 (e.g., live contacts). As shown in FIG. 6B, a portion of the base plates 132 having a relatively larger surface area may be interspersed with the contacts 133 (e.g., live electrical contacts) having a relatively smaller surface area than that of the base plates 132. In such embodiments, the base plates 132 may be utilized for thermal conductivity and/or mechanical stability, while the contacts 133 may be utilized for electrical conductivity (e.g., live contacts). While the apparatus 100' is illustrated in FIG. 6B as comprising a particular (e.g., symmetric) pattern of the base plates 132 and the contacts 133, it may be understood that such an arrangement is shown for illustrative purposes only and that any configuration (e.g., asymmetric, random, etc.) of the apparatus 100' including patterns of the base plates 132 and/or the contacts 133 may fall within the scope of such an embodiment.

Figure 7A:
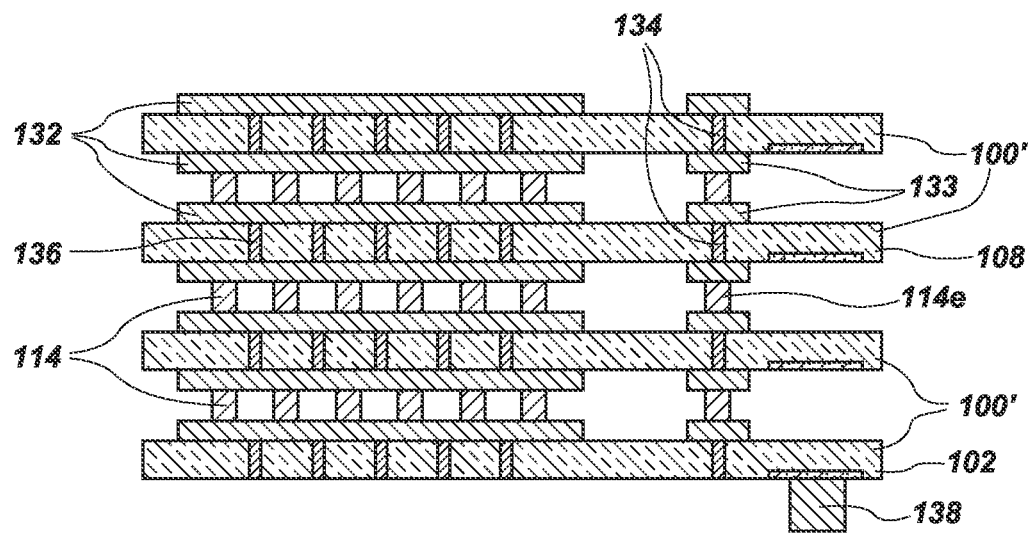
FIGS. 7A-7B are simplified, partial cross-sectional views of the microelectronic device of FIG. 4C in accordance with additional embodiments of the disclosure.
Figure 7B:
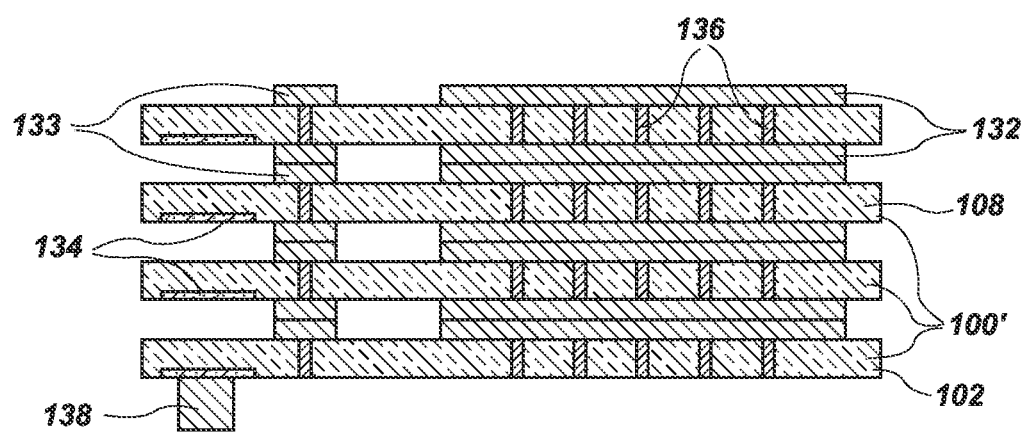

FIGS. 7A and 7B are simplified, partial cross-sectional views of the embodiments of FIGS. 5A through 5D and FIGS. 6A and 6B, respectively. As shown in FIG. 7A in combination with FIG. 7B, the base plates 132 may be located between adjacent apparatus 100' (e.g., semiconductor dice) of a stack of the base material 102 of the apparatus 100'. In the embodiment of FIG. 7A, the base plates 132 may be located overlying and/or underlying (e.g., on one or both sides of) at least some of the individual apparatus 100'. For example, portions of the base plates 132 may be located on the second passivation material 108, as discussed in greater detail above. In some embodiments, opposing base plates 132 located on an individual apparatus 100' may be connected (e.g., thermally connected) to one another using one or more thermal interconnects 136 (e.g., thermally conductive vias (TCVs)) while being electrically isolated from circuitry of the apparatus 100', as shown in the left-hand portion of the apparatus 100' of FIG. 7A. In some embodiments, placement of the base plates 132 may be dependent on placement of the thermal interconnects 136.

In addition, opposing electrically conductive contacts 133 (e.g., bond pads) located on an individual apparatus 100' may be connected (e.g., electrically connected) to one another using one or more of the electrical interconnects 134 (e.g., TSVs) as well as being electrically connected to circuitry of the apparatus 100', as shown in the right-hand portion of the apparatus 100' of FIG. 7A. Further, the apparatus 100' may include external conductive elements 138, for example, to connect circuitry of the stack of apparatus 100' to an interposer, base die (e.g., logic) or higher level packaging. In some embodiments, portions of the structural elements 114 (e.g., thermally conductive elements) may be located between the base plates 132, and the conductive elements 114e (e.g., electrically conductive elements) may be located between the contacts 133 of adjacent apparatus 100', as shown in FIG. 7A. In other embodiments, the base plates 132 and the contacts 133 may be configured to be directly adjacent one another without the structural elements 114 and the conductive elements 114e being located therebetween, as shown in FIG. 7B. In such embodiments, the base plates 132 and the contacts 133 may provide structural support to the individual tiers of the base material 102 of the apparatus 100'.

Once formed, the base plates 132 may increase reliability of the apparatus 100' by redistributing stress points and reducing passivation cracking. For example, the resulting profile of the apparatus 100' allows appropriate placement of the structural elements 114 formed on the base plates 132 and the conductive elements 114e formed on the contacts 133 without regard to underlying topography of the conductive segments 104. In addition, placement of the contacts 133 within regions including the conductive pads 130 (e.g., bond pads or probe pads) may prevent so-called "probe scrub" as well as degradation of conductive features. Further, use of the base plates 132 in such structures may result in increased thermal performance and heat transfer, as well as warp control of various components (e.g., individual tiers) of the base material 102 of the apparatus 100'. In particular, use of the base plates 132 may enable individual apparatus 100' to have a reduced thickness and may allow bond lines to have a reduced spacing between apparatus 100' (e.g., immediately adjacent one another). Further, simplified fabrication processes (e.g., thermocompression copper-to-copper bonding processes) facilitated by use of the base plates 132, as well as simplified fabrication processes to enhance the planarity among the structural elements 114, may result in the additional benefit of reducing manufacturing costs.

Accordingly, an apparatus comprises conductive segments, at least one passivation material overlying the conductive segments, and at least one base plate overlying the at least one passivation material. The apparatus also comprises structural elements overlying the at least one base plate. The at least one base plate may have a thickness sufficient to provide a substantially flat surface above an uneven topography comprising protruding portions of the underlying conductive segments above an upper surface of underlying materials.

Finally, it is also contemplated that the processes of the embodiment of the apparatus 100 may be combined with that of the apparatus 100'. In particular, the apparatus 100, 100' may each comprise passivation materials (e.g., the second passivation material 108) having a thickness sufficient to substantially smooth out underlying topography of the conductive segments 104 in addition to comprising one or more of the base plates 132 to provide adequate support to the structural elements 114. In other words, the second passivation material 108 and structural elements 114 of the apparatus 100 may be used in combination with the base plates 132 of the apparatus 100'. In some embodiments, the second passivation material 108, for example, may be formed to a thickness sufficient to substantially smooth out underlying topography of the conductive segments 104 prior to formation of the base plates 132 thereover. In other embodiments, the apparatus 100, 100' may comprise the second passivation material 108 including the upper regions 108b thereof in designated regions and comprise the base plates 132 in other regions. As a result, use of the second passivation material 108, alone or in combination with the base plates 132, provides an optimized thickness of passivation materials and/or conductive materials such that passivation cracking is reduced (e.g., minimized) along a perimeter of the base portions of the structural elements 114 and reliability of the apparatus 100, 100' is improved.

Figure 8:
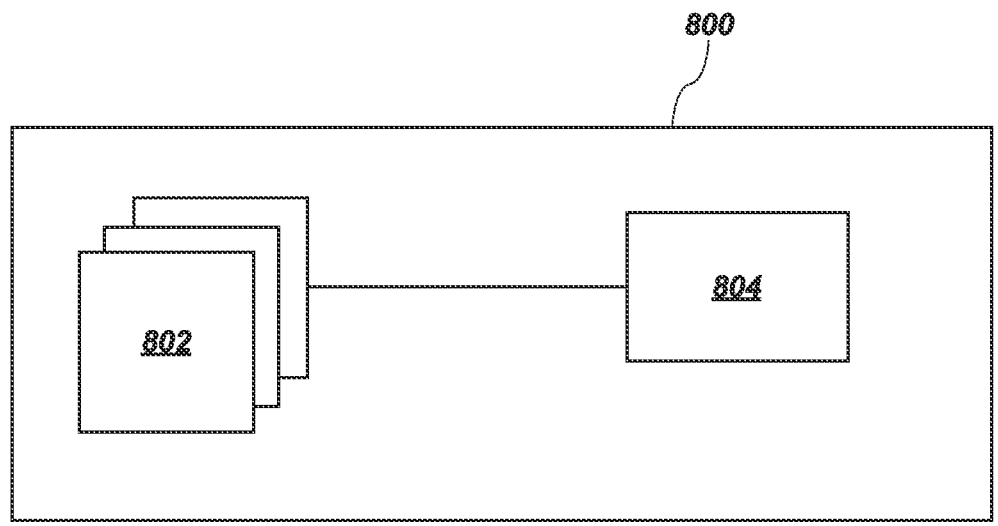
FIG. 8 is a schematic block diagram illustrating a memory device including one or more of the microelectronic devices in accordance with embodiments of the disclosure.

The apparatus 100, 100' according to embodiments of the disclosure may be used in a memory device 800 that includes one or more memory arrays 802 of memory cells. The memory device 800 (e.g., a DRAM device, a 3D NAND Flash memory device) is shown schematically in the functional block diagram of FIG. 8. The memory device 800 includes the memory arrays 802 of memory cells of multiple apparatus 100, 100' and a control logic component 804. The control logic component 804 may be configured to operatively interact with the memory array 802 so as to read, write, or refresh any or all memory cells within the memory arrays 802.

Accordingly, a memory device comprises an apparatus comprising conductive segments, a lower passivation material overlying the conductive segments, an upper passivation material overlying the lower passivation material, and structural elements overlying the upper passivation material. The upper passivation material is relatively thicker than the lower passivation material. The upper passivation material may have a thickness sufficient to smooth out abrupt topography changes between adjacent portions of the underlying conductive segments and further comprising support structures adjacent the structural elements.

Figure 9:
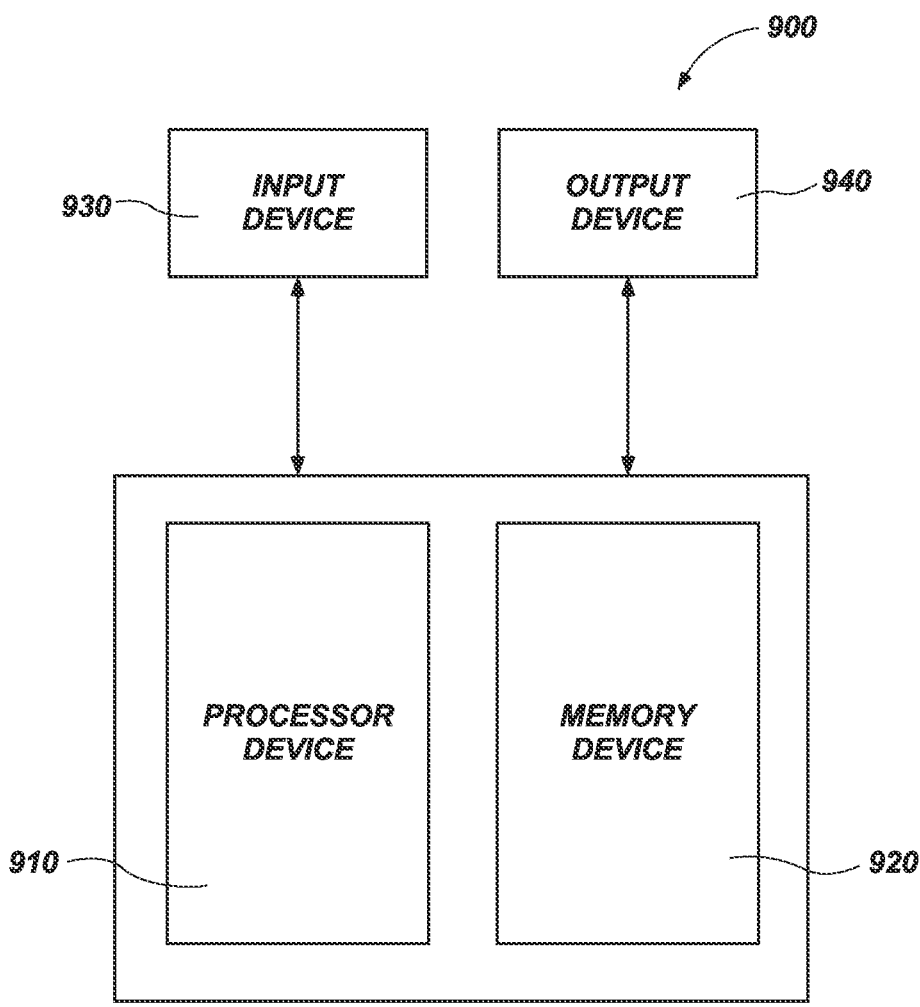
FIG. 9 is a schematic block diagram of an electronic system, in accordance with embodiments of the disclosure.

Microelectronic devices including device structures (e.g., the apparatus 100, 100') in accordance with embodiments of the disclosure may be used in embodiments of electronic systems of the disclosure. For example, FIG. 9 is a block diagram of an illustrative electronic system 900 according to embodiments of disclosure. The electronic system 900 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 900 includes at least one memory device 920. The memory device 920 may include, for example, an embodiment of a microelectronic device previously described herein (e.g., a stack of apparatus 100, 100') previously described herein. The electronic system 900 may further include at least one electronic signal processor device 910 (often referred to as a "microprocessor"). The electronic signal processor device 910 may, optionally, include an embodiment of a microelectronic device previously described herein (e.g., the apparatus 100, 100'). The electronic system 900 may further include one or more input devices 930 for inputting information into the electronic system 900 by a user, such as, for example, a mouse or other pointing device, a keyboard, a touchpad, a button, or a control panel. The electronic system 900 may further include one or more output devices 940 for outputting information (e.g., visual or audio output) to a user such as, for example, a monitor, a display, a printer, an audio output jack, a speaker, etc. In some embodiments, the input device 930 and the output device 940 may comprise a single touchscreen device that can be used both to input information to the electronic system 900 and to output visual information to a user. The input device 930 and the output device 940 may communicate electrically with one or more of the memory device 920 and the electronic signal processor device 910.

Accordingly, a microelectronic device comprises conductive segments, a first passivation material extending along upper surfaces and side surfaces of the conductive segments, and a second passivation material overlying the first passivation material. Lower regions of the second passivation material may substantially completely fill recessed regions between opposing sidewalls of the first passivation material. Upper regions of the second passivation material include a patterned surface structure comprising openings. The microelectronic device also comprises pillars located within the openings in the upper regions of the second passivation material. The pillars comprise a base portion substantially surrounded by the second passivation material and an upper portion having a greater lateral extent than the base portion thereof.

Accordingly, an electronic system comprising a processor device operably coupled to an input device and an output device and a memory device operably coupled to the processor device is disclosed. The memory device comprises memory cells, at least one of which comprises an apparatus comprising conductive segments, a lower passivation material overlying the conductive segments, and an upper passivation material overlying the lower passivation material. The upper passivation material is relatively thicker than the lower passivation material. The apparatus also comprises structural elements overlying the upper passivation material. The upper passivation material may have a thickness sufficient to smooth out abrupt topography changes between adjacent portions of the underlying conductive segments protruding above an upper surface of underlying materials and to provide support structures for the structural elements.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An apparatus, comprising:
   conductive segments;
   at least one passivation material overlying the conductive segments;
   at least one base plate overlying the at least one passivation material; and
   structural elements overlying the at least one base plate, the at least one base plate having a thickness sufficient to provide a substantially flat surface above an uneven topography comprising protruding portions of the underlying conductive segments above an upper surface of underlying materials, a bottom surface of the at least one base plate following a contour of the uneven topography of the underlying conductive segments.

2. The apparatus of claim 1, further comprising a seed material between the at least one passivation material and the at least one base plate, wherein the at least one passivation material includes an upper passivation material comprising a silicon nitride material overlying a lower passivation material comprising a silicon oxide material.

3. The apparatus of claim 1, wherein the at least one base plate comprises at least one of aluminum, copper, tungsten, titanium, or titanium nitride.

4. The apparatus of claim 1, further comprising at least one row of bond pads, contacts located thereover and conductive elements extending to substantially a same height as the structural elements in electrical contact with the bond pads through the contacts.

5. The apparatus of claim 1, wherein the at least one base plate and the structural elements comprise a same material, and an upper surface of the at least one base plate is coupled to the structural elements.

6. The apparatus of claim 1, wherein the at least one passivation material comprises a bottom surface following the contour of the uneven topography of the underlying conductive segments.

7. The apparatus of claim 1, wherein the structural elements comprise cylindrical pillars directly contacting the at least one base plate.

8. The apparatus of claim 1, wherein at least some of the structural elements are vertically aligned with a portion of the conductive segments while being electrically isolated therefrom.

9. The apparatus of claim 1, wherein the at least one base plate comprises a continuous sheet of material having a surface area of an upper surface thereof that is relatively greater than a surface area of a bottom surface of the structural elements.

10. A microelectronic device, comprising:
    conductive segments;
    a first passivation material extending along upper surfaces and side surfaces of the conductive segments;
    a second passivation material overlying the first passivation material, lower regions of the second passivation material substantially completely filling recessed regions between opposing sidewalls of the first passivation material, wherein upper regions of the second passivation material include a patterned surface structure comprising openings; and
    pillars located within the openings in the upper regions of the second passivation material, the pillars comprising a base portion substantially surrounded by the second passivation material and an upper portion having a greater lateral extent than the base portion thereof, at least some of the pillars in direct vertical alignment with a portion of the conductive segments while being electrically isolated therefrom.

11. The microelectronic device of claim 10, further comprising air gaps in the first passivation material or the second passivation material, the air gaps intervening between laterally adjacent portions of the conductive segments.

12. The microelectronic device of claim 10, wherein at least some of the pillars comprise thermal pillars, locations of the conductive segments being based, at least in part, on locations of the thermal pillars.

13. The microelectronic device of claim 10, further comprising conductive contacts overlying bond pads and aligned in at least one row laterally separating two or more regions of the pillars.

14. The microelectronic device of claim 10, wherein at least some of the pillars comprise a substantially circular cross-sectional shape, vertical protrusions of the patterned surface structure substantially surrounding and directly contacting sidewalls of the pillars.

15. The microelectronic device of claim 10, wherein the pillars are vertically and laterally supported by discrete portions of the patterned surface structure extending substantially transverse to an upper, substantially flat surface of the lower regions of the second passivation material, upper surfaces of the discrete portions are at an elevational level above the upper, substantially flat surface of the lower regions of the second passivation material.

16. A memory device, comprising:
an apparatus comprising:
conductive segments;
a lower passivation material overlying the conductive segments;
an upper passivation material overlying the lower passivation material, wherein the upper passivation material is relatively thicker than the lower passivation material; and
structural elements overlying the upper passivation material, the upper passivation material having a thickness sufficient to smooth out abrupt topography changes between adjacent portions of the underlying conductive segments and further comprising support structures adjacent the structural elements, at least some of the structural elements vertically aligned with a portion of the conductive segments while being electrically isolated therefrom.

17. The memory device of claim 16, wherein at least some of the structural elements comprise elongated bars of a conductive material laterally adjacent to elongated portions of the support structures extending above an upper surface of the upper passivation material.

18. The memory device of claim 16, wherein portions of the upper passivation material intervene between laterally adjacent portions of the conductive segments.

19. The memory device of claim 16, wherein the conductive segments are located and configured such that recessed regions between laterally adjacent portions of the conductive segments are not in vertical alignment with lateral side surfaces of the structural elements.

20. An apparatus, comprising:
conductive segments;
at least one passivation material overlying the conductive segments;
at least one base plate overlying the at least one passivation material;
structural elements overlying the at least one base plate, the at least one base plate having a thickness sufficient to provide a substantially flat surface above an uneven topography comprising protruding portions of the underlying conductive segments above an upper surface of underlying materials; and
a stack of two or more dies, wherein the at least one base plate includes individual base plates overlying and underlying at least some of the two or more dies of the stack and connected with one another through thermal interconnects.

* * * * *

UNITED STATES PATENT AND TRADEMARK OFFICE
CERTIFICATE OF CORRECTION

PATENT NO. : 11,769,738 B2
APPLICATION NO. : 17/339560
DATED : September 26, 2023
INVENTOR(S) : Kyle K. Kirby and Chao Wen Wang It is certified that error appears in the above-identified patent and that said Letters Patent is hereby corrected as shown below:

In the Specification
Column 5, Line 66, change "insulator ("SOT")" to --insulator ("SOI")--

Signed and Sealed this
Seventeenth Day of September, 2024

Katherine Kelly Vidal
*Director of the United States Patent and Trademark Office*